(12) United States Patent
Yamagata et al.

(10) Patent No.: US 6,388,273 B1
(45) Date of Patent: May 14, 2002

(54) SUBSTRATE MATERIAL FOR MOUNTING A SEMICONDUCTOR DEVICE, SUBSTRATE FOR MOUNTING A SEMICONDUCTOR DEVICE, SEMICONDUCTOR DEVICE, AND METHOD OF PRODUCING THE SAME

(75) Inventors: Shinichi Yamagata; Yugaku Abe; Makoto Imamura; Akira Fukui; Yoshishige Takano; Takatoshi Takikawa; Yoshiyuki Hirose, all of Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/692,162

(22) Filed: Oct. 20, 2000

Related U.S. Application Data

(62) Division of application No. 08/874,543, filed on Jun. 13, 1997, now Pat. No. 6,183,874.

(30) Foreign Application Priority Data

| Jun. 14, 1996 | (JP) | 8-175730 |
| Apr. 3, 1997 | (JP) | 9-84906 |
| May 9, 1997 | (JP) | 9-136164 |

(51) Int. Cl.$^7$ .............................................. H01L 23/15
(52) U.S. Cl. ........................................................ 257/77
(58) Field of Search ............................................ 257/77

(56) References Cited

U.S. PATENT DOCUMENTS

| 4,352,120 A | | 9/1982 | Kurihara et al. |
| 4,664,946 A | | 5/1987 | Enomoto et al. |
| 4,715,892 A | * | 12/1987 | Mahulikar et al. ............ 75/233 |
| 4,796,077 A | | 1/1989 | Takeda et al. |
| 4,958,216 A | | 9/1990 | Tanaka et al. |
| 5,006,417 A | | 4/1991 | Jackson et al. |
| 5,040,588 A | * | 8/1991 | Newkirk et al. ............... 164/97 |
| 5,435,825 A | * | 7/1995 | Kusui et al. ................... 75/232 |
| 5,501,263 A | * | 3/1996 | Dwivedi et al. ............... 164/97 |
| 5,511,603 A | * | 4/1996 | Brown et al. .................. 164/97 |
| 5,532,513 A | | 7/1996 | Smith et al. |
| 5,775,403 A | | 7/1998 | Prekumar et al. |
| 5,780,164 A | | 7/1998 | Puzik et al. |

FOREIGN PATENT DOCUMENTS

| EP | 0 135 120 | 3/1985 |
| EP | 0 219 933 | 4/1987 |
| EP | 0 237 047 | 9/1987 |
| EP | 0 566 360 | 10/1993 |
| JP | 9-157773 | 6/1997 |

OTHER PUBLICATIONS

Patent Abstracts of Japan, vol. 008, No. 200 (E–266), Sep. 13, 1984, & JP 59 088851 A (Ibiden KK), May 22, 1984.
Patent Abstracts of Japan, vol. 097, No. 002, Feb. 28, 1997, & JP 08 279569 A (Sumitomo Metal Ind Ltd), Oct. 22, 1996.

* cited by examiner

*Primary Examiner*—Archene Turner
(74) *Attorney, Agent, or Firm*—McDermott, Will & Emery

(57) ABSTRACT

To provide a substrate material made of an aluminum/silicon carbide composite alloy which has a thermal conductivity of 100 W/m×K or higher and a thermal expansion coefficient of $20\times10^{-6}/°$ C. or lower and is lightweight and compositionally homogeneous. A substrate material made of an aluminum/silicon carbide composite ally which comprises Al—SiC alloy composition parts and non alloy composition part and dispersed therein from 10 to 70% by weight silicon carbide particles, and in which the fluctuations of silicon carbide concentration in the Al—SiC alloy composition parts therein are within 1% by weight. The substrate material is produced by sintering a compact of an aluminum/silicon carbide starting powder at a temperature not lower than 600° C. in a non-oxidizing atmosphere.

1 Claim, 6 Drawing Sheets

SUBSTRATE MATERIAL FOR MOUNTING A SEMICONDUCTOR DEVICE, SUBSTRATE FOR MOUNTING A SEMICONDUCTOR DEVICE, SEMICONDUCTOR DEVICE, AND METHOD OF PRODUCING THE SAME

This is a division of application Ser. No. 08/874,543, filed Jun. 13, 1997, now U.S. Patent 6,183,874.

BACKGROUND OF THE INVENTION

1. Field of the Invention

The present invention relates to a substrate material for use as, e.g., a heat sink material in a semiconductor device, and also to a substrate, a semiconductor device, and method of producing the same.

2. Description of the Prior Art

With the recent remarkable increases of the processing rate of semiconductor devices and the degree of integration in semiconductor devices, the heat generated by semiconductor elements has come to produce influences that are not negligible. As a result, substrate materials for mounting semiconductor devices have come to be required to have a high thermal conductivity for efficiently removing the heat generated by semiconductor elements.

Substrate materials are further required not to be deformed by a thermal stress at the interface between the substrate materials and other device members used in combination therewith. Hence, substrate materials are required not to have a large difference in thermal expansion coefficient with semiconductor chips, packages, etc. used in combination therewith. Specifically, since the thermal expansion coefficients of silicon and GaAs, both used as semiconductor elements, are as low as $4.2 \times 10^{-6}/°$ C. and $6.5 \times 10^{-6}/°$ C., respectively, and that of $Al_2O_3$, which is widely used as a packaging material, is also as low as $6.5 \times 10^{-6}/°$ C., substrate materials desirably have low thermal expansion coefficients which are almost the same as the above values.

In recent years, plastics have come to be increasingly used as packaging materials in place of ceramics such as $Al_2O_3$. In the case of using a plastic package, the substrate material used therewith can have a higher thermal expansion coefficient than in conventional semiconductor devices, because the plastic has a high thermal expansion coefficient and a semiconductor element is bonded thereto with a resin. Namely, the optimal range of the thermal expansion coefficients which semiconductor substrate materials are required to have is from $7 \times 10^{-6}$ to $20 \times 10^{-6}/°$ C., although it varies depending on combinations with other device members including packaging materials; those values are high and that range is wide as compared with the case of ceramic packages.

Conventionally in the case where a low thermal expansion coefficient is necessary, substrate materials for carrying a semiconductor device of a Cu—W composite alloy or a Cu—Mo composite alloy have been frequently used. Since these alloys can be regulated in thermal expansion so as to be suitable for use with plastics by controlling the amount of copper or molybdenum, they can be also applicable to with plastic packages. However, because of their low rigidity, the plastics are apt to deform when used in combination with materials having a high specific gravity, such as Cu—W alloys and Cu—Mo alloys, and this limits the use of these alloys as substrate materials in combination with plastic packages.

For electrically connecting a semiconductor element to a package, a technique of using solder bumps in place of wires (flip chip bonding) and a technique of using solder balls in place of pins for connection to a base substrate (ball grid array bonding) have come to be widely used. These techniques also have difficulties in application to substrate materials made of a Cu—W alloy or a Cu—Mo alloy, because the use of such heavy substrate materials may flatten the solder balls excessively. In addition, the use of substrate materials made of these alloys is disadvantageous in cost because tungsten and molybdenum are relatively expensive metals.

On the other hand, in the case where a high thermal expansion coefficient is desired, substrate materials made of Al or Cu, which are inexpensive metals, or of an alloy of these have been frequently employed. However, these semiconductor substrate materials have the same problem as the Cu—W alloys or the like because Cu also has a density as high as $8.9 \text{ g/cm}^3$. Substrate materials made of aluminum are free from the above problem when used in combination with plastic packages and connected by ball grid array bonding, since the density of aluminum is as low as $2.7 \text{ g/cm}^3$. However, substrate materials made of aluminum have problems that they can be used in only limited applications because aluminum has a thermal expansion coefficient as high as $23.5 \times 10^{-6}/°$ C., and that the substrates are apt to warp or deform because of their low rigidity.

Under these circumstances, there is a desire for a substrate material which not only can be regulated so as to have any thermal expansion coefficient in the wide range of from $7 \times 10^{-6}$ to $20 \times 10^{-6}/°$ C., especially from $7 \times 10^{-6}$ to $15 \times 10^{-6}/°$ C., but also has high heat dissipation properties and is lightweight. It is thought that substrate materials should generally have a thermal conductivity of at least 100 W/m·K. However, there are increasing cases where the semiconductor substrate materials used in combination with plastic packages, having a poor thermal conductivity, are required to have a thermal conductivity of 180 W/m·K or higher when heat dissipation from the whole package is taken in account.

Aluminum composite alloys were recently proposed as materials which are lightweight and satisfy the above-described requirements concerning thermal expansion coefficient and thermal conductivity. Among these, use of an aluminum/silicon carbide (Al—SiC) composite alloy as a substrate material is being investigated because the starting materials, i.e., aluminum and silicon carbide, both are relatively inexpensive and highly thermally conductive, and because a wide range of thermal expansion coefficients can be obtained by combining silicon carbide, having a low thermal expansion coefficient of $4.2 \times 10^{-6}/°$ C., with aluminum, having a high thermal expansion coefficient of $23.5 \times 10^{-6}/°$ C., in various proportions.

Conventionally employed processes for producing such an aluminum/silicon carbide composite alloy include the casting method disclosed, e.g., in Tokuhyo-Hei-1-501489 (unexamined published PCT application), the impregnation method described, e.g., in JP-A-2-243729 (the term "JP-A" as used herein means an "unexamined published Japanese patent application"), and the pressure casting method disclosed, e.g., in JP-A-61-222668.

For use in fields where high reliability is required, the substrate materials obtained are generally subjected to a surface treatment before being used as semiconductor substrates.

In order to use an aluminum/silicon carbide composite alloy as a substrate material for mounting a semiconductor device, the above-described production methods each has problems which should be solved.

First, the casting method has a drawback that the deviation of composition which is caused during cooling is difficult to avoid. This is because since the Al—SiC alloy produced by the casting method necessarily has a higher aluminum concentration in the surface part, the difference in silicon carbide concentration between the central and surface parts exceeds 1% by weight, making it impossible to obtain a material having a homogeneous composition. It is also difficult to completely eliminate voids. Although the pressure casting method is effective in eliminating most voids, the concentration of aluminum around the surface tends to be high due to the pressure applied. It is hence difficult in the pressure casting method to reduce the difference in silicon carbide concentration between the central and surface parts to 1% by weight or smaller.

On the other hand, the impregnation method in which a preform of silicon carbide is impregnated with molten aluminum has a drawback that aluminum should be infiltrated in an excess amount in order to obtain a completely dense alloy. Consequently, the alloy obtained has the excess aluminum on the periphery thereof and cannot have the original shape of the preform before impregnation. It is therefore difficult to obtain a substrate material having satisfactory dimensional precision. For obtaining the desired dimensions, it is necessary to conduct an operation for removing the excess aluminum from the whole periphery. In the pressure infiltration method, in which a preform of silicon carbide is placed in a pressure vessel and molten aluminum is forced into the vessel, the resulting alloy has an aluminum film corresponding to the clearance between the preform and the pressure vessel. Since this aluminum film is uneven in thickness, it not only impairs the low thermal expansion coefficient of the alloy material, but is causative of warpage, etc.

The casting method has another drawback that since the method involves the step of casting a molten metal, the concentration of aluminum in the melt should be at least 70% by weight. In the pressure casting method also, a melt having a silicon carbide concentration not lower than 30% by weight has poor flowability and has been unsuitable for use in producing alloys of complicated shapes, resulting in poor production efficiency. It has been found that alloys which can be produced by the impregnation method so as to retain the same dimensions as the preform and to be optionally dense have compositions in which the concentration of silicon carbide is around 70% by weight This is because if an alloy having a silicon carbide concentration lower than 70% by weight is to be produced, the silicon carbide preform has a reduced strength and is hence apt to deform or warp during impregnation with aluminum or during subsequent cooling due to a difference in thermal expansion coefficient. As a result, the alloy obtained hardly retains the same dimensions as the preform.

Further drawbacks of the impregnation method are that since the framework of the alloy produced is constituted of silicon carbide, warpage correction by sizing after alloying is impossible, and that the processing of the alloy is possible only by grinding with a diamond wheel and is hence costly. The pressure casting method has a further problem that it has a far higher equipment cost than the casting and impregnation methods. Therefore, it has been difficult to produce an aluminum/silicon carbide composite alloy having a homogeneous composition in which the silicon carbide concentration is higher than about 30% by weight but not higher than about 70% by weight at low cost by any of those prior art methods.

Substrate materials for use in plastic packages of semiconductor devices are frequently required to have a thermal expansion coefficient of about from $7 \times 10^{-6}$ to $13 \times 10^{-6}/°$ C. for the reasons as set forth above. In order for an aluminum/silicon carbide composite alloy to meet this requirement, the alloy should have a silicon carbide concentration of from 50 to 70% by weight. It has however been difficult to produce an alloy having such a composition at low cost by any of the casting, impregnation, and pressure casting methods described above. It has also been difficult to obtain an aluminum/silicon carbide composite alloy having a thermal conductivity of 180 W/m·K or higher by any of those prior art methods, except in the case of alloys having silicon carbide concentrations exceeding 70% by weight or below 10% by weight.

Although an aluminum/silicon carbide composite alloy as it is can be used as a semiconductor substrate material, it is desirably subjected to a surface treatment when the composite alloy is to be used in fields where high reliability is required, e.g., in work stations. For use in these fields, semiconductor substrate materials are required not to suffer any change in properties, e.g., thermal conductivity, or in appearance, etc., through various reliability tests such as a thermal cycling test in which the substrate materials are repeatedly exposed to −65° C. and 150° C., a PCT (pressure cooker test) in which the substrate materials are exposed to an atmosphere of 121° C., 100% RH, and 2 atm., and an HAST (highly accelerated stress test) in which the substrate materials are exposed to an atmosphere of 125° C., 85% RH, and 2 atm. However, the exposed aluminum part on the surface discolors through these tests. Discoloration is apt to occur also at the Al/SiC interface. Hence, the substrate materials undergo a considerable change in appearance through the above tests. It is therefore necessary to perform a surface treatment suitable for aluminum/silicon carbide composite alloys and to use a technique for the treatment.

The surface state of a substrate material for mounting a semiconductor device is important, because it influences the flow of solder when a semiconductor chip or a package is fixed to the substrate formed by the material by using solders. For use with some solders, a surface treatment suitable therefore is necessary in order to ensure reliability with respect to the strength and other properties of soldering parts. The surface state is important also in bonding with a resin, which technique is becoming the mainstream recently. Since different surface states result in different strengths of resin bonding, a surface treatment suitable for the desired bonding strength is required.

Aluminum/silicon carbide composite alloys have a high degree of hardness. Therefore it is very difficult to form a shape, especially a complex shape such as heatsink by using aluminum/silicon carbide composite alloys. It is required that a substrate material is able to be formed easily to be near net shape precisely.

SUMMARY OF THE INVENTION

In view of the current situation as described above, an object of the present invention is to eliminate the problems concerning precision in forming, cost, etc. to provide a substrate material for mounting a semiconductor device, made of a lightweight aluminum/silicon carbide composite alloy which has a homogeneous composition and has the properties required of a substrate material, i.e., a thermal conductivity of 100 W/m·K or higher and a thermal expansion coefficient of $20 \times 10^{-6}/°$ C. or lower.

Another object of the present invention is to provide a substrate for mounting a semiconductor device, having higher reliability.

Another object of the present invention is to provide a method of forming a substrate which has a thermal expansion coefficient with a large range so as to be appropriate for a semiconductor chip or a package to be fixed to the substrate.

And another object of the present invention is to provide a substrate formed easily to be near net shape precisely.

To accomplish the above objects, the present invention provides a substrate material for mounting a semiconductor device, made of an aluminum/silicon carbide composite alloy which comprises an Al—SiC alloy composition part and a non alloy part and dispersed homogeneously silicon carbide granular particles. Silicon carbide granular particles are dispersed from 10 to 70% by weight in the composite alloy, and silicon carbide is distributed homogeneously in the Al—SiC alloy composition part. And the fluctuations of silicon carbide concentration in the Al—SiC alloy composition parts is within 1% by weight, and which has a thermal conductivity of 100 W/m·K or higher and a thermal expansion coefficient of $20 \times 10^{-6}/°$ C. or lower.

This aluminum/silicon carbide composite alloy is produced by a sintering method. The aluminum/silicon carbide composite alloy constituting the substrate material of the present invention preferably contains aluminum carbide formed at the interface between the silicon carbide and the aluminum or aluminum alloy. Preferably aluminum carbide is comprised in such an amount that the ratio of the peak intensity for aluminum carbide (012) to that for aluminum (200) both determined by X-ray analysis with $CuK_\alpha$ line is not more than 0.025 or its analytical amount is not more than 5% by weight. This substrate material simultaneously further contains silicon in the aluminum or aluminum alloy, and the silicon is present as a component of a solid solution or as a precipitate.

This aluminum/silicon carbide composite alloy has a thermal conductivity of 180 W/m·K or higher. It is especially suitable for use as a semiconductor substrate material for a ceramic package, etc.

The present invention further provides a process for producing the substrate material which comprises compacting an aluminum/silicon carbide starting powder having a silicon carbide content of from 10 to 70% by weight, and sintering the compact at a temperature of 600° C. or higher in a non-oxidizing atmosphere in order to prevent aluminum from oxidizing to produce an aluminum/silicon carbide composite alloy. Preferably such process is employed by sintering a power mixture compact contained aluminum and silicon carbide, namely a sintering method which differs from some conventional process above described. By this process of the present invention, a substrate material can be obtained which is made of a lightweight aluminum/silicon carbide composite alloy having a homogeneous composition and having a thermal expansion coefficient of $20 \times 10^{-6}/°$ C. or lower and a thermal conductivity of 100 W/m·K or higher.

The sintering process of the present invention for producing an aluminum/silicon carbide composite alloy, is especially capable of yielding an aluminum/silicon carbide composite alloy having a thermal conductivity of 180 W/m·K or higher by regulating the sintering temperature to a value in the range of from 600 to 750° C. to thereby control the interfacial reaction which yields the aluminum carbide and the silicon.

A preferred atmosphere for the sintering is a nitrogen atmosphere having a nitrogen concentration of 99% by volume or higher. It is also preferred to conduct the sintering in an atmosphere having an oxygen concentration of 200 ppm or lower and a dew point of −20° C. or lower.

Especially when the aluminum/silicon carbide composite alloy has a thermal expansion coefficient of from $7 \times 10^{-6}$ to $15 \times 10^{-6}/°$ C. and a thermal conductivity of 180 W/m·K or higher, it is suitable for use as a substrate material for a semiconductor mounted on a plastic package or as a substrate used for semiconductor devices in which the electrical connection of a semiconductor element is conducted by flip chip bonding or mounting on a package is conducted by ball grid array bonding.

A substrate having higher reliability can be formed by coating the surface of the material of the present invention with a plating layer, chromate film, or oxide film, or by forming on the surface thereof a layer of a metal having a Young's modulus of 15,000 kg/mm² or lower, a layer of a metal having a melting point of 600° C. or lower, or a layer of an organic resin and then forming thereon a layer of nickel or gold, or by forming on the surface thereof a coating layer comprising aluminum as the main component.

DESCRIPTION OF THE PREFERRED EMBODIMENTS

Figure 1:
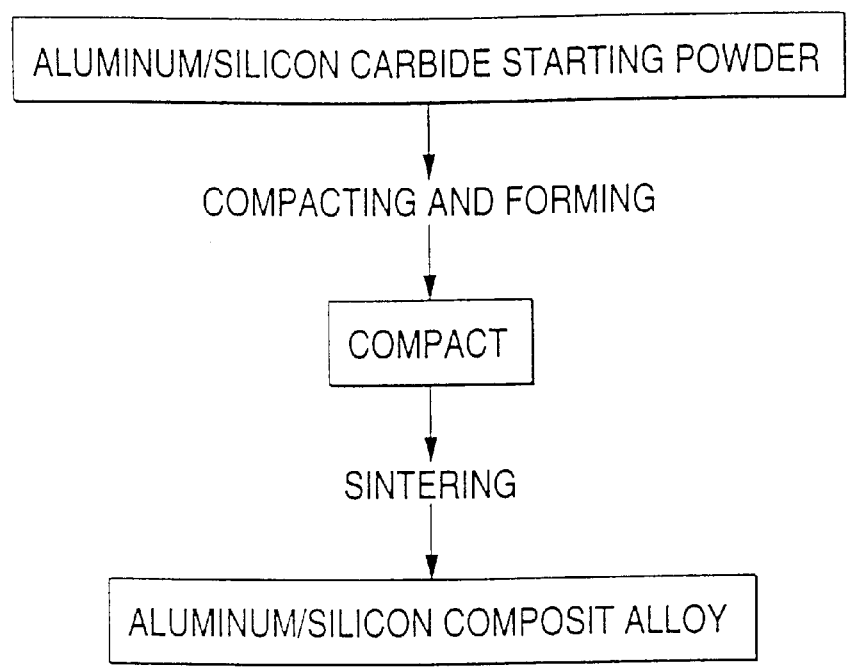
FIG. 1 shows a block diagram illustrating a process for producing an aluminum/silicon carbide composite alloy according to the present invention.

In the present invention, an aluminum/silicon carbide composite alloy useful as a semiconductor substrate material is produced by sintering to thereby provide a semiconductor substrate material having the desired values of thermal conductivity and thermal expansion coefficient and having a homogeneous Al—SiC composition and a near-net shape, i.e., excellent dimensional precision, the attainment of both of which has been difficult in conventional processes. This substrate material is capable of coping with, not only conventional ceramic packages and, metal packages but also in particular, plastic packages, flip chip bonding, and ball grid array bonding.

That is, since the aluminum/silicon carbide composite alloy according to the present invention is produced from an aluminum/silicon carbide granular particle as starting powder having a silicon carbide content of from 10 to 70% by weight by compacting the powder and sintering the compact, the aluminum or aluminum alloy constitutes a continuous metal structure, while the silicon carbide is homogeneously dispersed as particles unlike the silicon carbide in aluminum/silicon carbide alloys produced by the infiltration method.

The crystal forms of silicon carbide include hexagonal α-SiC form, which is formed at a high-temperature, and cubic β-SiC form, which is formed at a low-temperature. Although these two forms do not differ in the thermal conductivity of an alloy, α-silicon carbide is susceptible to cleavage. Due to this property, use of α-silicon carbide in a starting powder is apt to result in silicon carbide cleavage due to the pressure applied during compaction into a desired substrate shape. As a result of the cleavage, the compact may contain aggregates made up of fine silicon carbide particles. Since the aggregates have poor adhesion to aluminum in an alloy, they tend to suffer debonding of particles when the alloy is subjected to processing such as grinding, barrel, shot blasting, etc. in the final step. It is therefore desirable to use β-silicon carbide or a mixture of α-silicon carbide and β-silicon carbide. "Debonding of particles" means that particles are displaced from the position to be in the alloy, and the surface of the alloy grows porous.

If debonding of particles occurs, the resulting rough surface may have the problems of reduced solder flowability and reduced adhesion strength in resin bonding. Since the degree of surface roughness caused by the debonding of particles is equal to the particle diameter of the silicon carbide used, it is preferred to use silicon carbide having a smaller particle diameter in order to prevent solder flowability and resin bonding strength from decreasing. However, too small particle diameters are apt to cause aggregation and may result in an enhanced surface roughness. Consequently, the particle diameter of the silicon carbide is preferably from 1 to 100 $\mu$m, more preferably from 10 to 80 $\mu$m.

On the other hand, by intentionally forming a surface roughness, the bonding strength of a resin can be improved based on the anchoring effect thereof. In this case, anchoring effect means the state where bonded surfaces engaged physically each other owing to their roughness. In this case also, a surface having too high a roughness may have a reduced bonding strength because vacant spaces not filled with a resin, can remain. A surface having too low a roughness does not produce an anchoring effect. From this standpoint also, the particle diameter of the silicon carbide is preferably from 1 to 100 $\mu$m, more preferably from 10 to 80 $\mu$m.

As will be described later in detail, the sintering method, in which granular particles as a starting powder comprising homogeneously dispersed particles of aluminum and silicon carbide are compacted and then sintered, yields an alloy having a homogeneous structure because particle movement is little during these steps. The alloy obtained by the sintering method therefore can be exceedingly reduced in compositional difference between the central and surface parts thereof, which difference has been a problem in the conventional casting method, pressure casting method and infiltration method. Specifically, the fluctuations of silicon carbide concentration in the Al—SiC alloy composition parts can be reduced to a value within 1% by weight. The expression "fluctuations of silicon carbide concentration in Al—SiC alloy composition parts" used herein means that the Al—SiC alloy composition parts, i.e., the alloy excluding any oxide or nitride layer usually formed on the alloy surface and further excluding any aluminum layer such as that formed on the alloy surface in a conventional method, are compared with one another in compositional homogeneity with respect to silicon carbide concentration. For determining that difference, central and surface parts of the alloy composition parts are analyzed for SiC concentration by examining a 0.5 mm$^2$ area for each part with an electron microscope. The ratio of area SiC occupied to that of whole area corresponding to each examined visual field by the electron microscope.

If the concentration of silicon carbide in the aluminum or aluminum alloy is lower than 10% by weight, thermal expansion coefficients exceeding 20×10$^{-6}$/° C. result. If the concentration thereof exceeds 70% by weight, densification is difficult in the sintering method because of the too small aluminum proportion. In the present invention, the amount of silicon carbide in the aluminum/silicon carbide composite alloy is hence regulated to from 10 to 70% by weight. In particular, regulating the concentration of silicon carbide to a value in the range of from 35 to 70% by weight is effective in obtaining an aluminum/silicon carbide composite alloy having a thermal expansion coefficient in a range which has not been attainable with any prior art technique, i.e., from 7×10$^{-6}$ to 15×10$^{-6}$/° C.

In the sintering of an aluminum/silicon carbide mixture, an interfacial reaction which yields aluminum carbide ($Al_3C_4$) and silicon plays an important role. It has become clear that if this interfacial reaction proceeds excessively, the resultant composite alloy has a reduced thermal conductivity mainly because the aluminum carbide generated at the interface in too large an amount inhibits thermal conduction through the aluminum/silicon carbide interface, and because the silicon generated and present in too large an amount as a component of a solid solution in aluminum enhances heat dispersion.

In each of the conventional infiltration, casting, and pressure casting methods, it is difficult to control the interfacial reaction between aluminum and silicon carbide since each method is intended to alloy aluminum in a completely melted state. Because of the use of aluminum as a melt, the interfacial reaction proceeds excessively to yield large amounts of aluminum carbide and silicon, or proceeds insufficiently to result in poor adhesion between the aluminum and silicon carbide and hence in inefficient heat transfer. Consequently, the thermal conductivities of the alloys obtained by those conventional methods are below 180 W/m·K. In contrast, in the present invention, the interfacial reaction can be easily controlled by employing the sintering method and, as a result, an aluminum/silicon carbide composite alloy having a thermal conductivity of 180 W/m·K or higher can be obtained.

Specifically, an alloy having a thermal conductivity of 180 W/m·K or higher can be obtained by regulating the sintering temperature to from 600 to 750° C. as described later to thereby regulate the amount of the aluminum carbide formed by the interfacial reaction so that the ratio of the peak intensity for aluminum carbide (012) to that for aluminum (200) both determined by X-ray analysis with CuK$_\alpha$ line is not more than 0.025. An alloy having a thermal conductivity of 180 W/m·K or higher can be obtained also by regulating the amount of the aluminum carbide not more than to 5% by weight. If the amount of the aluminum carbide is below the lower limit of the above range, the interfacial reaction is insufficient and densification does not proceed. On the other hand, if the amount thereof exceeds the upper limit, the thermal conductivity of the alloy is below 180 W/m·K for the reason stated above.

The process of the present invention for producing a semiconductor substrate material is then explained. As shown in FIG. 1, an aluminum/silicon carbide starting powder is first prepared which comprises aluminum or an aluminum alloy and from 10 to 70% by weight silicon carbide. Although various techniques may be used for preparing the starting powder, it is necessary to employ a technique which imparts to the starting powder satisfactory suitability for compaction and sintering. For example, a mixture of a powder of either aluminum or an aluminum alloy with a powder of silicon carbide can be used as a starting powder. Although this technique is the simplest and most inexpensive, the two powders should be mixed until the mixture becomes homogeneous. Since the particle sizes of the two powders strongly influence the mixability thereof, the average particle diameter of the one powder is desirably up to two times that of the other powder.

A rapidly solidified powder prepared by solidifying an alloying melt comprising a mixture of aluminum or an aluminum alloy with silicon carbide may also be used as a starting powder. The starting powder obtained by this technique has exceedingly high homogeneity and excellent suitability for compaction. It is also possible to use a starting powder obtained by mechanically alloying a powder of either aluminum or an aluminum alloy with a silicon carbide powder. Either pure aluminum or an aluminum alloy may be used as a material for a starting powder. Pure aluminum is useful for easily obtaining a compact having an increased density because of the high deformability thereof, and is the most effective in heightening thermal conductivity. However, due to its high deformability, pure aluminum may cause seizing in the mold depending on the shape of the mold. This seizing can be prevented by using an alloy of aluminum with, e.g., silicon to thereby keep the particles hard.

Subsequently, the aluminum/silicon carbide starting powder thus obtained is compacted into a desired substrate shape, as shown in FIG. 1. This compaction serves to adhere the particles of the starting powder to one another beforehand to thereby enable the resulting compact to retain its shape during the subsequent sintering without breaking and to give a dense sinter. Finally, this compact is sintered in a non-oxidizing atmosphere in order to prevent aluminum from oxidizing. The sintering should be conducted at a temperature of 600° C. or higher, because sintering temperatures lower than 600° C. result in insufficient bonding among particles.

As stated above, the sintering in the process of the present invention is conducted in a non-oxidizing atmosphere for aluminum. A useful non-oxidizing atmosphere is a nitrogen atmosphere preferably having a nitrogen concentration of 99% by volume or higher. Such a nitrogen atmosphere serves not only to prevent oxidation but to generate aluminum nitride (AlN) through the reaction of nitrogen with aluminum, thereby yielding an aluminum/silicon carbide composite alloy containing nitrogen. On the other hand, in the case of using a non-oxidizing atmosphere comprising hydrogen, carbon monoxide, or a rare gas such as argon, the alloy obtained contains no nitrogen.

In ordinary sintering, densification is generally inhibited by the gas remaining within the alloy. However, the use of nitrogen as a non-oxidizing atmosphere was found to be effective in densification because the nitrogen gas remaining within the alloy turns into aluminum nitride through reaction with aluminum. An alloy containing nitrogen especially in an amount of 0.01% by weight or larger is advantageous for attaining a thermal conductivity of 180 W/m·K or higher. However, if the content of nitrogen exceeds 1% by weight, densification is inhibited rather than enhanced. Therefore the preferred range of the nitrogen content in the aluminum/silicon carbide composite alloy is from 0.01 to 1% by weight.

If a sintering atmosphere containing oxygen or steam is used, aluminum is oxidized, resulting in impaired properties. It is therefore desirable to conduct sintering in an atmosphere having an oxygen concentration of 200 ppm or lower and a dew point of −20° C. or lower. When this non-oxidizing atmosphere is used to conduct sintering, no oxidation reaction proceeds during the sintering, and the resultant alloy contains the same amount of oxygen as the starting powder used. Namely, the aluminum/silicon carbide composite alloy obtained has an oxygen content of from 0.05 to 0.5% by weight.

In the present invention, the interfacial reaction between aluminum and silicon carbide can be controlled by regulating the sintering temperature to from 600 to 750° C. as described above. If the sintering temperature exceeds 750° C., the carbonization of aluminum proceeds due to the interfacial reaction. As a result, the amount of aluminum carbide yielded at the interface exceeds the upper limit of the 5 wt % range, and the aluminum or aluminum alloy contains silicon as a component of a solid solution therein or as a precipitate in an amount larger than the upper limit of the 3 wt % range. Such too large amounts of aluminum carbide and silicon contained in the aluminum/silicon carbide composite alloy reduce the thermal conductivity of the alloy. It is therefore necessary to use a sintering temperature of from 600 to 750° C. for attaining a thermal conductivity of 180 W/m·K or higher.

Liquid-phase sintering can be conducted in the process of the present invention, in which the compact is heated to or above the melting point of aluminum or the aluminum alloy. It has been thought that in a liquid-phase sintering system in which the proportion of the liquid phase is 30% or larger, shape retention is generally difficult because of the outflow or foaming of the liquid phase. However, the compact according to the present invention can retain its shape even in liquid-phase sintering because silicon carbide has exceedingly high wettability by aluminum. In particular, a compact having a silicon carbide content of from 35 to 70% by weight well retains its shape with high precision even in liquid-phase sintering.

The aluminum/silicon carbide composite alloy thus produced through sintering can be used as a substrate material without conducting any treatment. However, the composite alloy may be repressed in a non-oxidizing atmosphere, or may be repressed and then heated in an non-oxidizing atmosphere. Since the composite alloy has a structure comprising a matrix of aluminum, which is highly deformable, and hard silicon carbide particles dispersed therein, repressing is effective not only in attaining a further improvement in precision, but also in removing residual voids and densifying the composite alloy to thereby greatly change the shape thereof. Although the alloy may develop fine cracks during this repressing, the cracks can be eliminated by heating the repressed alloy in a non-oxidizing atmosphere.

And according to aluminum/silicon carbide composite alloys formed as above, a substrate can be formed precisely to be near net shaped or in net shaped without warp or deform. In this case it is not required to machine process with respect to the whole surface.

For use as a substrate such as workstation having higher reliability, the substrate material should be subjected to a surface treatment. Possible techniques for surface treatment include plating, chromating, anordic oxidation to form an alumite film, other oxidation treatment, and organic resin coating.

In plating, the substrate material is plated with nickel or Ni—Au to thereby protect the aluminum parts, which are susceptible to oxidation. Chromate treatment is preferred in that film formation on the surface of the semiconductor substrate material is easy and a film can be homogeneously formed even when the surface is highly rough. A plated substrate material can be made to have further improved reliability by conducting chromating as a final step. Oxidation treatment such as anodic oxidation is also preferred in that film formation is easy and a film can be evenly formed even when the surface of the substrate material is rough. This oxidation can be accomplished by exposing the substrate material to the air at a temperature of about from 200 to 600° C. or exposing the same to a steam atmosphere heated to about from 200 to 600° C. Further subjecting the oxidized semiconductor substrate material to chromate treatment is effective in ensuring even higher reliability. Further coating a surface of the substrate with a film made of organic resin such as an epoxy resin, a silicone resin, a polyimide resin, or the like, is more effective in ensuring even higher reliability.

A rough surface resulting from the debonding of particles may have the problems of impaired solder flowability and reduced resin bonding strength. These problems can be significantly mitigated by sealing the surface with an organic or metallic material prior to plating.

In a technique for the sealing treatment with an organic material, the surface is coated with an epoxy resin, a silicone resin, a polyimide resin, or the like by screen printing, dipping, spinner coating, or another means. The electrical conductivity of the surface may be maintained by using a resin containing silver or copper as a filler. The organic film thus formed on the surface is cured and then polished to complete the sealing treatment.

One possible technique for the sealing treatment with a metallic material is plating. A metal film is formed by plating in a thickness larger than depth of the depressions, and the metal layer on the surface of the substrate is polished. Thus, the surface roughness of the substrate material can be completely eliminated. Preferred examples of the metal plated include those having a Young's modulus of 15,000 kg/mm$^2$ or lower, e.g., copper. Metals having such a low Young's modulus can be easily polished, and are capable of readily filling up the depressions because they are drawn out by polishing. On the other hand, if a metal having a Young's modulus higher than 15,000 kgf/mm$^2$, e.g., nickel, is formed by plating, the metal is not drawn out by polishing and cannot completely fill up the depressions. A substrate material plated with copper alone readily rusts in reliability tests. Hence, by subjecting the copper-plated and then polished substrate material to plating with nickel, the resultant substrate can satisfy not only the requirement concerning solder flowability and resin bonding strength but also reliability.

Barrel plating is desirably used for forming a layer of a metal having a Young's modulus of 15,000 kg/mm$^2$ or lower on the semiconductor substrate material. Barrel plating has an advantage that the plated objects have no jig marks since the works are plated in a suspended state in the container. During the barrel plating operation, the works repeatedly collide with one another in the plating bath. When dummy particles are introduced into the container, the works collide also with the dummy particles. Upon the collisions, the dummy particles are abraded and the resultant debris of the dummy particles adhere to the works being plated. This adhesion is more apt to occur in the depressions of the surface, thereby mitigating the surface roughness. The dummy particle debris adherent to the works preferably are easily drawn out. Namely, the dummy particles are preferably made of a material having a low Young's modulus, specifically 15,000 kgf/mm$^2$ or lower, e.g., copper. Metals having such a low Young's modulus can be easily drawn out and are capable of readily filling up the depressions. If a material having a Young's modulus higher than 15,000 kgf/mm$^2$, e.g., nickel, is used, it is not drawn out and cannot completely fill up the depressions. The dummy particles desirably have a particle diameter of from 0.1 to 10 mm. If dummy particles smaller than 0.1 mm are used, they undergo insufficient collisions during barrel plating and are hence unable to completely fill up the depressions. Dummy particles larger than 10 mm are undesirable in that the works being plated are damaged by the particles. The dummy particles desirably have such a shape that the surface area thereof is large. By regulating the dummy particles so as to have a surface area at least two times that of the corresponding spheres, the dummy particles can exhibit their effect in a reduced time period for barrel plating.

A further technique for eliminating a surface roughness is to use a metal which melts at low temperatures, for example, to plate the surface with tin. The semiconductor substrate material plated with tin is heated to at least 240° C. which is the melting point of tin, whereby the tin melts and flows into the depressions. As a result, a surface free from roughness can be formed. The molten tin takes up aluminum, silicon, etc. as impurities to come to have an increased melting point. The solidified tin layer therefore does not melt again even in a later soldering operation. Metals usable in this technique are those having a melting point not higher than the sintering temperature for the aluminum/silicon carbide composite alloy, i.e., not higher than 600° C.

Formation of a coating layer comprising aluminum as the main component is effective in improving the bonding strength of a resin.

In forming an aluminum layer by vapor deposition or the like, polygonal crystal grains generate. Although there are minute differences in level of 1 $\mu$m or smaller among the crystal grains, these level differences are not detected in a surface roughness measurement. A combination of the diameter of the crystal grains with those level differences among the crystal grains produces a sufficient anchoring effect.

By regulating the diameter of the crystal grains constituting of the coated aluminum layer to from 0.1 to 10 $\mu$m, a sufficient anchoring effect can be produced. If the crystal grains have a diameter smaller than 0.1 $\mu$m, a resin used for bonding cannot sufficiently infiltrate into spaces among the crystals and this often results in vacant holes, which are apt to lead to a bonding failure. If the crystal grains have a diameter larger than 10 μm, a sufficient bonding strength cannot be obtained because the number of grains per unit area which contribute to an anchoring effect is small, although a resin can infiltrate into spaces among the crystals.

In the case of a substrate for mounting a semiconductor device, having such a structure in which a sufficient anchoring effect is obtained, there is no particular need of forming an oxide film. Namely, this substrate desirably has a native oxide layer having a thickness of from 10 to 800 Å. If there is no native oxide layer, no hydrogen bonds are formed between the substrate and a resin, so that sufficient bonding strength cannot be maintained. If the substrate has an oxide film having a thickness exceeding 800 Å, the bonding strength between the oxide film and the base metal cannot be maintained because of the brittleness of the metal oxide film, although the bonding strength between the oxide film and a resin is satisfactory.

The thickness of the aluminum layer formed is preferably from 1 to 100 μm. If the thickness thereof is smaller than 1 μm, there are cases where a structure sufficient to produce an anchoring effect cannot be formed. On the other hand, if the thickness thereof is larger than 100 μm, breakage is apt to occur within the film. Since the formation of an aluminum film thicker than 20 μm may require much time, the more preferred range of aluminum film thickness is from 1 to 20 μm.

The aluminum film formed may be made of either aluminum or an aluminum alloy. However, use of an aluminum alloy is disadvantageous in that compositional control during film formation is difficult and the adhesion thereof to the base is apt to unstable. An aluminum film having a purity of preferably 99.9% by weight or higher, more preferably 99.99% by weight or higher, is desirable because of its diminished fluctuations in adhesion to the base.

The surface state of the base on which an aluminum film is to be formed is desirably regulated so as to have a surface roughness in the range of from 0.1 to 20 μm in terms of $R_{max}$ as provided for in JIS. If the surface roughness, $R_{max}$, thereof is lower than 0.1 μm, a sufficient anchoring effect is difficult to obtain even when an aluminum film having the structure described above is formed. If the $R_{max}$ thereof is higher than 20 μm, the amount of adsorbed gas increases, so that the base releases an increased amount of oxygen during film formation thereon. For example, if an aluminum film is formed on such a rough surface by vapor deposition at a degree of vacuum higher than $10^{-3}$ Torr, the resulting aluminum film disadvantageously is made of crystal grains having a diameter smaller than 0.1 μm or has impaired adhesion to the base. For bases having an $R_{max}$ higher than 20 μm, it is difficult to attain a degree of vacuum of $10^{-3}$ Torr or lower. Values of $R_{max}$ higher than 8 μm are usually undesirable in that after the base surface is bonded with a resin, vacant spaces are apt to remain between the resin and the surface, resulting in enhanced fluctuations of bonding strength. Therefore, the $R_{max}$ of the base is more desirably regulated to 8 μm or lower. For satisfying the above requirement, the base surface is desirably regulated so as not to have holes having a depth exceeding 100 μm. If the base surface has holes having a depth exceeding 100 μm, not only gas adsorption occurs in a larger amount as stated above, but also a film having a uniform thickness is difficult to form on the base. In this case, the film formed is apt to have pits. In addition, a resin used for bonding is less apt to sufficiently infiltrate into the spaces, resulting in insufficient bonding strength.

A possible technique for forming an aluminum film is vapor deposition. First, a test piece is introduced into a chamber for vacuum deposition. Prior to deposition, the chamber is evacuated. The degree of vacuum in this stage influences the quality of the aluminum film to be formed. A vacuum of $10^{-5}$ Torr or lower is desirable. If a higher degree of vacuum is used, the test piece releases an adherent gas during deposition and the aluminum grains formed tend to have a reduced diameter. After evacuation, aluminum is deposited. A preferred deposit source is aluminum having a purity of 99.9% by weight or higher. If a source consisting of aluminum having a purity up to around 99% by weight is used, compositional control is difficult and enhanced fluctuations of adhesion to the base are apt to result. During the deposition, the degree of vacuum is preferably regulated to $10^{-3}$ Torr or lower. If a higher degree of vacuum is used, the aluminum grains formed have a diameter smaller than the desired value. During the deposition, the test piece may be or may not be kept heated. Even without heating, the temperature of the surface of the test piece usually rises to about 100 to 200° C.

An aluminum film can also be obtained by applying a dispersion of aluminum particles in an organic solvent by screen printing and then sintering the coating in an inert, vacuum, or reducing atmosphere. In this technique also, the atmosphere for sintering is crucially important for obtaining an aluminum film having the desired grain diameter.

Still another technique which can be used for obtaining an aluminum film comprises applying a dispersion of aluminum particles in an organic solvent by dipping and then sintering the coating in an inert, vacuum, or reducing atmosphere. A further technique usable for obtaining an aluminum film comprises forming an aluminum coating by flame spraying under an inert or reducing gas atmosphere and then sintering the aluminum coating in an inert, vacuum, or reducing atmosphere. In each technique, the atmosphere for sintering is crucially important for obtaining an aluminum film having the desired grain diameter. When the sintering is employed in vacuum, it is allowable to control the sintering atmosphere in the same manner of the above-described upper deposition process. However, in the case using an inert gas or reducing gas, an impurity gaseous content in such gas is necessary to be controlled lower than 500 ppm, because the grain diameter of the aluminum film is apt to become smaller by adhering a gas such as oxygen, which generates from the substrate, on the aluminum film surface.

The aluminum/silicon carbide composite alloy thus obtained can be used as a semiconductor substrate material having a thermal expansion coefficient of $20 \times 10^{-6}/°$ C. or lower and a thermal conductivity of 100 W/m·K or higher. It is also possible to obtain an alloy having a thermal expansion coefficient of $15 \times 10^{-6}/°$ C. or lower and a thermal conductivity as high as 180 W/m·K or higher, which values have not been attained with any prior art technique. This alloy is suitable for use as a semiconductor substrate material for a plastic package. Since the alloy is lightweight, it is also suitable for flip chip bonding for electrically bonding a semiconductor element to a package or for ball grid array bonding to a base substrate. Furthermore, by subjecting the alloy to a surface treatment, it can be used as a substrate for mounting a semiconductor device, having higher reliability.

EXAMPLE 1

An aluminum powder having an average particle diameter of 25 μm was mixed in various proportions with a silicon carbide powder consisting of a mixture of α-crystals and β-crystals and having an average particle diameter of 50 μm to prepare sample powders 1 to 9 respectively having silicon carbide contents of 5%, 10%, 20%, 30%, 40%, 50%, 60%, 70%, and 75% by weight. These sample powders each was homogenized with a kneader for 1 hour to obtain aluminum/silicon carbide starting powders.

The starting powders obtained were compacted at a pressure of 7 t/cm$^2$ to obtain tablet test pieces having a diameter of 20 mm and a height of 30 mm. These compacts were sintered at 700° C. for 2 hours in a nitrogen atmosphere having a nitrogen concentration of 99% by volume or higher. As a result, aluminum/silicon carbide composite alloy sinters were obtained which retained the original shape of the compacted test pieces. However, the alloy of sample 9 was not dense and had voids in a surface layer thereof; this alloy was hence not subjected to the following measurements.

Each sinter was examined for SiC content, density after sintering, thermal conductivity, thermal expansion coefficient, nitrogen content, oxygen content, aluminum carbide content, and the ratio of the peak intensity for aluminum carbide (012) to that for aluminum (200) both determined by X-ray analysis with CuK$_\alpha$ line. The results obtained are shown in Table 1. Density was determined by the Archimedes' method. Thermal conductivity was determined by the laser flash method. Thermal expansion coefficient was determined by averaging found values obtained with a push rod type apparatus in the temperature range of from 20 to 200° C. Nitrogen content was determined by gas analysis. Content of SiC was determined by pulverizing an alloy, removing all components excluding SiC and silicon with an acid, dissolving the silicon in hydrofluoric acid, and calculating the SiC content from the resulting weight change. Aluminum carbide content was determined by pulverizing an alloy, dissolving aluminum carbide with sodium hydroxide, and calculating the aluminum carbide content from the amount of the methane gas generated. Further, each alloy was examined by X-ray analysis with CuK$_\alpha$ line to determine the ratio of the peak intensity for aluminum carbide (012) to that for aluminum (200).

Figure 2:
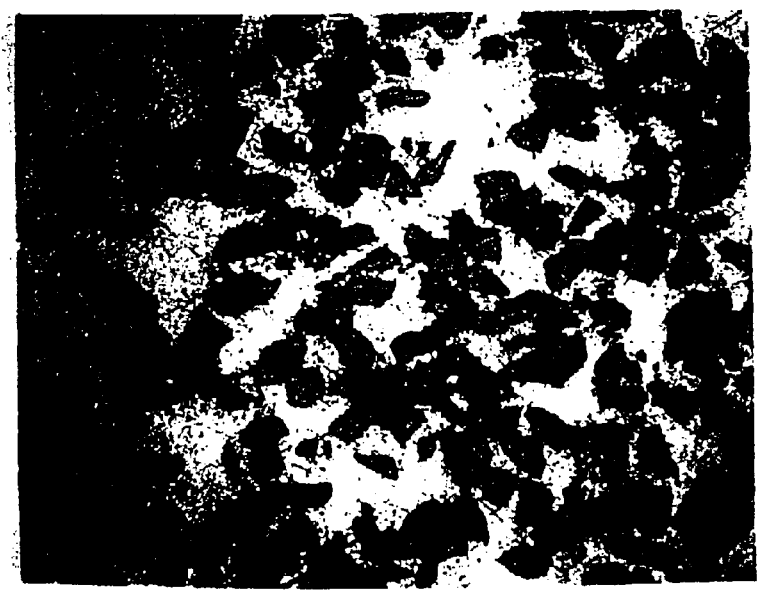
FIG. 2 is a photomicrograph taken with an optical microscope (100 times) showing the metal structure of the aluminum/silicon carbide composite alloy obtained as sample 6 in Example 1.

A photomicrograph taken with an optical microscope (×100) of a metal structure of the alloy of sample 6 is shown in FIG. 2. As apparent from FIG. 2, the aluminum/silicon carbide composite alloy of the present invention had a micro structure comprising aluminum (light gray parts) and silicon carbide granular particles (black parts) dispersed therein. Furthermore, with respect to each of samples 1 to 8, the surface layers thereof, i.e., the oxide layer, the nitride layer, and the SiC-free aluminum, were removed and the remaining Al—SiC alloy composition parts were examined for difference in SiC content as follows. Central and surface parts of the Al—SiC alloy composition parts were compositionally analyzed with an electron microscope with respect to an area of 0.5 mm$^2$ for each part to determine the SiC contents thereof. As a result, the difference in SiC content was within 1% by weight in each alloy. From the compositional electron microscopy, it was ascertained that in each of samples 1 to 8, aluminum carbide was present at the interface between the aluminum and the silicon carbide and silicon was present mainly as a component of a solid solution in aluminum and partly as a precipitate.

In order to compare with the examples, following were examined. Firstly, a silicon carbide powder having an average particle diameter of 35 μm and a silicon carbide powder having an average particle diameter of 5 μm were mixed in a weight ratio of 3:1, and added a binder. These sample powders homogenized with a kneader for 1 hour to obtain silicon carbide starting powders.

The starting powders obtained were compacted at a pressure of 7 t/cm$^2$ to obtain tablet test pieces having a diameter of 20 mm and a height of 30 mm. These compacts were sintered in a nitrogen atmosphere to remove a binder. Then after degassing the tablet test pieces in a pressured chamber, they were pressure-infiltrated in an aluminum melt. As a result, aluminum/silicon carbide composite alloy having silicon carbide contents of 71% by weight were obtained. It was difficult to obtain aluminum/silicon carbide composite alloy having silicon carbide contents of less than 70% by weight by similar method. Because more porosity in the formed silicon carbide compact is required, and the formed silicon carbide compact is not stiff enough to keep its shape.

Secondly, a silicon carbide powder having an average particle diameter of 35 μm and a silicon carbide powder having an average particle diameter of 5 μm were mixed in a weight ratio of 3:1, further added 5 weight % of Al-1 wt % Mg powder and added a binder. These sample powders were homogenized with a kneader for 1 hour to obtain silicon carbide starting powders.

The starting powders obtained were compacted at a pressure of 7 t/cm$^2$ to obtain tablet test pieces having a diameter of 20 mm and a height of 30 mm. After compacting, Al-1 wt % Mg alloy pellets were set, as infiltrating agent, on one side surface of silicon carbide compacts and then these compact assemblies were heated to 800° C. in a nitrogen atmosphere to infiltrate the molten infiltrating agent. Then as a result, aluminum/silicon carbide composite alloy having silicon carbide contents of 71% by weight were obtained. It was difficult to obtain desire-shaped aluminum/silicon carbide composite alloy having silicon carbide contents of less than 70% by weight by similar method, because of large deformation of compacts during the infiltration. Thirdly, 30% by weight of a silicon carbide powder having an average particle diameter of 35 μm is added to molten aluminum and then this mixture is pressure-casted to obtain tablet test pieces having a diameter of 20 mm and a height of 30 mm. It was difficult to obtain aluminum/silicon carbide composite alloy having silicon carbide contents of more than 35% by weight by similar method, because an amount of aluminum is so much that it cannot be pressure-casted. Further in order to compare with the examples, aluminum/silicon carbide composite alloy having silicon carbide contents of 38% by weight equal to the sample 5, were produced by the method of infiltration and the method of casting. After removing an aluminum layer and melted out part, central and surface parts of the Al—SiC alloy composition parts were compositionally analyzed with an electron microscope with respect to an area of 0.5 mm$^2$ for each part to determine the SiC contents thereof. As a result, the difference in SiC content excesses 2% by weight in each alloy.

TABLE 1

| Sample | Sic content (wt%) | Density (g/cm³) | Thermal conductivity (W/m · K) | Thermal expansion coefficient (×10⁻⁶/° C.) | Nitrogen content (wt %) | Oxygen content (wt %) | $Al_4C_3$ content (wt %) | $Al_4C_3$ (012)/ Al(200) |
|---|---|---|---|---|---|---|---|---|
| 1* | 3 | 2.69 | 238 | 21.9 | 0.28 | 0.42 | 0.7 | 0.001 |
| 2* | 8 | 2.71 | 235 | 20.2 | 0.28 | 0.40 | 1.8 | 0.003 |
| 3 | 18 | 2.75 | 229 | 17.3 | 0.27 | 0.31 | 2.2 | 0.005 |
| 4 | 28 | 2.79 | 224 | 15.8 | 0.27 | 0.23 | 2.7 | 0.009 |
| 5 | 38 | 2.78 | 215 | 14.0 | 0.25 | 0.20 | 2.8 | 0.015 |
| 6 | 48 | 2.76 | 201 | 12.5 | 0.24 | 0.18 | 2.7 | 0.020 |
| 7 | 58 | 2.75 | 192 | 9.4 | 0.23 | 0.16 | 1.7 | 0.021 |
| 8 | 67 | 2.72 | 185 | 7.5 | 0.24 | 0.15 | 1.1 | 0.019 |
| 9* | — | not densified | — | — | — | — | — | — |

(Note) The samples indicated by * are comparative examples.

Table 1 shows that the aluminum/silicon carbide composite alloys having a silicon carbide content in the range of from 10 to 70% by weight satisfied the requirement that the thermal conductivity be 100 W/m·K or higher and the thermal expansion coefficient be 20×10⁻⁶/° C. or lower. It was further understood that the alloys having a silicon carbide content in the range of from 35 to 70% by weight had a thermal expansion coefficient of 15×10⁻⁶/° C. or lower.

EXAMPLE 2

An aluminum powder having an average particle diameter of 25 μm was mixed in a weight ratio of 1:1 with a silicon carbide powder consisting of a mixture of α-crystals and β-crystals and having an average particle diameter of 50 μm. This mixture was homogenized with a kneader for 1 hour to obtain an aluminum/silicon carbide starting powder. The starting powder obtained was compacted at a pressure of 7 t/cm² to obtain tablet test pieces having a diameter of 20 mm and a height of 30 mm. These compacts were sintered in a nitrogen, hydrogen, or argon atmosphere under the conditions shown in Table 2. As a result, aluminum/silicon carbide composite alloy sinters were obtained which retained the original shape of the compacted test pieces.

Each sinter was examined for density, thermal conductivity, thermal expansion coefficient, nitrogen content, oxygen content, aluminum carbide content, and the ratio of the peak intensity for aluminum carbide (012) to that for aluminum (200) both determined by X-ray analysis with CuK$_α$ line. The results obtained are shown in Table 2. These properties were determined by the same methods as in Example 1. The results given in Table 2 show that alloys having a thermal conductivity of 100 W/m×K or higher could be obtained by conducting sintering at temperatures not lower than 600° C. The results further show that alloys having a thermal conductivity of 180 W/m·K or higher could be obtained by conducting sintering at 600 to 750° C. to regulate the amount of the aluminum carbide yielded by an interfacial reaction to such a value that the ratio of the peak intensity for aluminum carbide (012) to that for aluminum (200) both determined with CuK$_α$ line was equal to or lower than 0.025 or that the aluminum carbide content was equal to or lower than 5% by weight. The results furthermore show that the alloys obtained through sintering in the atmospheres other than nitrogen had a nitrogen content lower than 0.01% by weight and a thermal conductivity lower than 180 W/m× K.

TABLE 2

| Sample | Sintering conditions (° C. × h) | Sintering atmosphere | Density (g/cm³) | Thermal conductivity (W/m × K) | Thermal expansion coefficient (×10⁻⁶/ °C.) | Nitrogen content (wt %) | Oxygen content (wt %) | $Al_4C_3$ content (wt %) | $Al_4C_3$ (012)/ Al(200) |
|---|---|---|---|---|---|---|---|---|---|
| 10 | 900 × 2 | nitrogen | 2.72 | 118 | 12.3 | 0.32 | 0.20 | 8.3 | 0.060 |
| 11 | 850 × 2 | nitrogen | 2.75 | 161 | 12.3 | 0.30 | 0.20 | 7.9 | 0.053 |
| 12 | 800 × 2 | nitrogen | 2.75 | 173 | 12.5 | 0.29 | 0.19 | 7.5 | 0.051 |
| 13 | 800 × 8 | nitrogen | 2.75 | 175 | 12.5 | 0.31 | 0.19 | 7.7 | 0.053 |
| 14 | 750 × 2 | nitrogen | 2.76 | 185 | 12.5 | 0.28 | 0.19 | 4.0 | 0.023 |
| 15 | 700 × 2 | nitrogen | 2.76 | 201 | 12.5 | 0.24 | 0.18 | 2.7 | 0.020 |
| 16 | 700 × 8 | nitrogen | 2.75 | 203 | 12.6 | 0.28 | 0.19 | 2.8 | 0.024 |
| 17 | 650 × 2 | nitrogen | 2.77 | 221 | 12.7 | 0.20 | 0.18 | 1.2 | 0.013 |
| 18* | 550 × 2 | nitrogen | 2.78 | 46 | 18.0 | 0.08 | 0.18 | 0 | 0 |
| 19 | 700 × 2 | hydrogen | 2.70 | 162 | 12.3 | <0.01 | 0.17 | 2.4 | 0.02 |
| 20 | 700 × 2 | argon | 2.70 | 165 | 12.3 | <0.01 | 0.17 | 2.5 | 0.02 |

(Note) The sample indicated by * is a comparative example. Sample 15 is the same as sample 6 in Example 1.

EXAMPLE 3

Some of the aluminum/silicon carbide composite alloy sinters obtained as sample 6 in Example 1 were repressed at a pressure of 7 t/cm² in a nitrogen atmosphere (sample 6-1).

Part of the repressed sinters were sintered again at 700° C. for 2 hours in a nitrogen atmosphere (sample 6-2).

These sinter samples were examined for density, thermal conductivity, thermal expansion coefficient, nitrogen content, oxygen content, aluminum carbide content, and the ratio of the peak intensity for aluminum carbide (012) to that for aluminum (200) both determined by X-ray analysis with $CuK_\alpha$ line, in the same manner as in Example 1. The results obtained are shown in Table 3. It is understood from Table 3 that repressing and resintering were effective in heightening the density and improving the thermal conductivity.

piece was pulled at a rate of 50 mm/min while taking care to keep the major axis of the test piece and the center line of the grips on the same straight line. The maximum load at the time of test piece breakage was recorded, and this value was divided by the area of the resin bonding region of the test piece. This quotient was taken as the bonding strength. The test piece breakage occurred in the resin bonding region. The results obtained are shown in Table 4.

For the purpose of comparison, the tensile strength of the resin alone used for bonding was measured as follows. The liquid resin was formed into a sheet, cured at 180° C. for 1 hour, and then dried at 150° C. for 24 hours. The strength thereof after the drying was 2 $kgf/mm^2$. The strength thereof after 100 thermal cycles was 1.6 $kgf/mm^2$, that after the 100-hour PCT was 1.2 $kgf/mm^2$, and that after the 100-hour HAST was 1.3 $kgf/mm^2$.

TABLE 3

| Sample | Sintering conditions (° C. × h) | Density (g/cm$^3$) | Thermal conductivity (W/m × K) | Thermal expansion coefficient (×10$^{-6}$ ° C.) | Nitrogen content (wt %) | Oxygen content (wt %) | $Al_4C_3$ content (wt %) | $Al_4C_3$ (012)/ Al(200) |
|---|---|---|---|---|---|---|---|---|
| 6 | 700 × 2 sintering | 2.76 | 201 | 12.5 | 0.24 | 0.18 | 2.7 | 0.02 |
| 6-1 | sintering → repressing | 2.80 | 203 | 12.9 | 0.24 | 0.18 | 2.7 | 0.02 |
| 6-2 | repressing → resintering | 2.82 | 225 | 12.9 | 0.26 | 0.18 | 2.8 | 0.02 |

EXAMPLE 4

An aluminum powder having an average particle diameter of 25 μm was mixed with each of silicon carbide powders having average particle diameters ranging from 0.1 to 150 μm, in such a proportion as to result in a silicon carbide content of 50% by weight. These mixtures each was homogenized with a kneader for 1 hour to obtain aluminum/silicon carbide starting powders.

The starting powders obtained were compacted at a pressure of 7 t/cm$^2$ to obtain test pieces having dimensions of 50 mm by 25 mm by 2 mm (thickness). These compacts were sintered at 700° C. for 2 hours in a nitrogen atmosphere having a nitrogen concentration of 99% by volume or higher. As a result, aluminum/silicon carbide composite alloy sinters were obtained which retained the original shape of the compacted test pieces.

Figure 11:
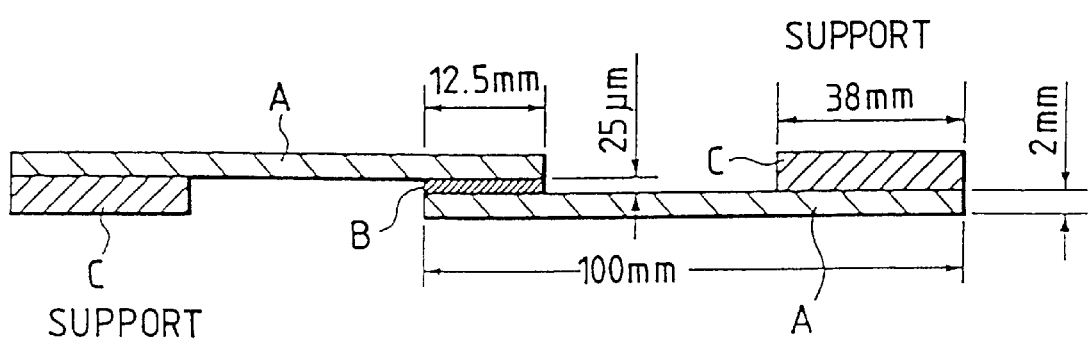
FIG. 11 is a diagrammatic sectional view illustrating a test piece used for measuring a bonding strength between the substrate material of the present invention and resin.

The samples thus produced were evaluated for resin bonding strength in accordance with JIS K 6850 as follows. A liquid epoxy resin containing 70% by weight silver filler was applied to a sample piece in a resin thickness of 25 μm. This sample piece was placed on another Al—SiC sample piece in the manner shown in FIG. 11. The resultant structure was heated at 180° C. for 1 hour to cure the resin, and then dried at 150° C. for 24 hours.

The test pieces thus obtained according to JIS K 6850 were examined for bonding strength after the drying and after each of the thermal cycling test, PCT, and HAST. In the thermal cycling test, the strength was measured after 100 cycles each consisting of 30-minute exposure to a 150° C. atmosphere and 30-minute exposure to −65° C. atmosphere. In the PCT, the strength was measured after a 100-hour treatment under the partial-saturation conditions of 121° C., 100% RH, and 2 atm. In the HAST, the strength was measured after a 100-hour treatment under the conditions of 125° C., 85% RH, and 2 atm. The measurement of bonding strength was made with a precision universal tester (Autograph). In the manner shown in FIG. 11, a test piece bonded to which two test substrates A are bonded, was held by the holding regions C with the grips of the tester. The test

TABLE 4

| Sample | SiC content (wt %) | Particle diameter of SiC (mm) | Initial strength (kgf/ mm$^2$) | Strength after thermal cycling (kgf/mm$^2$) | Strength after PCT (kgf/mm$^2$) | Strength after HAST (kgf/mm$^2$) |
|---|---|---|---|---|---|---|
| *21 | 50 | 0.1 | 1.0 | 0.6 | 0.3 | 0.4 |
| 22 | 50 | 1 | 1.2 | 0.8 | 0.5 | 0.6 |
| 23 | 50 | 10 | 1.5 | 1.0 | 0.8 | 0.9 |
| 24 | 50 | 50 | 1.5 | 1.0 | 0.8 | 0.9 |
| 25 | 50 | 80 | 1.4 | 0.9 | 0.7 | 0.8 |
| 26 | 50 | 100 | 1.2 | 0.8 | 0.5 | 0.6 |
| *27 | 50 | 150 | 1.0 | 0.8 | 0.3 | 0.4 |

The results show that the Al—SiC sinters obtained using SiC powders each having an average particle diameter of from 1 to 100 μm could retain satisfactory bonding strengths not lower than 1.0 (kf/mm$^2$) at the initial stage and not lower than 0.5 (kgf/mm$^2$) after the reliability tests.

EXAMPLE 5

An aluminum powder having an average particle diameter of 25 μm was mixed with a silicon carbide powder having an average particle diameter of 35 μm in such a proportion as to result in a silicon carbide content of 50% by weight. The mixture was homogenized with a kneader for 1 hour in the same manner as in the above Example 4. Thus, an aluminum/silicon carbide starting powder was obtained. The starting powder obtained was compacted at a pressure of 7 t/cm$^2$. The resultant compacts were sintered at 700° C. for 2 hours in a nitrogen atmosphere having a nitrogen concentration of 99% by volume or higher. As a result, aluminum/silicon carbide composite alloy sinters were obtained which retained the original shape of the compacted test pieces.

One of the alloys as sample 28 obtained was treated with an alkaline solution for 1 minute to etch the aluminum. The resultant surface was subjected to zincate conversion and then electroless nickel-phosphorus plating. Thus, sample 28 was obtained. The deposit formed by the plating had a thickness of 5 µm.

Another alloy as sample 29 was subjected to alumite treatment in a sulfuric acid bath at a current density of 1.5 A/dm², and then boiled in ion-exchanged water to seal the holes. Thus, sample 29 was obtained. The sample had a 5-mm alumite layer on the aluminum, but had no alumite layer on the SiC.

Still another alloy as sample 30 was subjected to a chromating, in which the alloy was immersed in a phosphate-chromate treating liquid at 50° C. for 1 minute, immediately washed with water, and then dried at 80° C. Thus, sample 30 was obtained. The chromate layer deposited had a thickness of 500 Å.

A further alloy as sample 31 was plated with nickel-phosphorus in a thickness of 5 µm by the same method as the above. A 500-Å chromate layer was then formed thereon by the same method as the above. Thus, sample 31 was obtained.

Still a further alloy sample as sample 32 was subjected to an oxidation treatment, in which the sample was heated in the air at 300° C. for 1 hour. Thus, sample 32 was obtained. Still a further alloy as sample 33 was heated in a steam atmosphere at 300° C. for 1 hour to obtain sample 33.

The test pieces obtained above were subjected to the PCT to evaluate corrosion resistance. In the PCT, the appearance of each test piece was examined after a 100-hour treatment under the partial-saturation conditions of 120° C., 100% RH, and 2 atm. The results obtained are shown in Table 5.

The sample 28 treated only by nickel-phosphorus plating had uncovered parts where the deposit was not present, and these parts were found after the PCT to have stained. In the sample 29 which had undergone the alumite treatment, the surface SiC parts remained uncovered with alumite, and staining was observed at the interface between the alumite parts and the SiC parts. No change in appearance was observed in the other samples even after the PCT.

TABLE 5

| | |
|---|---|
| Sample 28 | staining occurred |
| Sample 29 | staining occurred at alumite layer/SiC particle interface |
| Sample 30 | ◯ |
| Sample 31 | ◯ |
| Sample 32 | ◯ |
| Sample 33 | ◯ |

EXAMPLE 6

An aluminum powder having an average particle diameter of 25µm was mixed with a silicon carbide powder having an average particle diameter of 35 µm in such a proportion as to result in a silicon carbide content of 50% by weight. The mixture was homogenized with a kneader for 1 hour in the same manner as in the above Examples. Thus, an aluminum/silicon carbide starting powder was obtained. The starting powder obtained was compacted at a pressure of 7 t/cm². The resultant compacts were sintered at 700° C. for 2 hours in a nitrogen atmosphere having a nitrogen concentration of 99% by volume or higher. As a result, aluminum/silicon carbide composite alloy sinters, sample 34, were obtained which retained the original shape of the compacted test pieces. The dimensions of each sinter were 50 mm by 25 mm by 2 mm (thickness).

One of the alloys obtained was subjected to a chromate treatment, in which the alloy was immersed in a phosphate-chromate treating liquid at 50° C. for 1 minute, immediately washed with water, and then dried at 80° C. Thus, sample 35 was obtained. The chromate layer deposited had a thickness of 500 Å.

Another alloy sample was subjected to an oxidation treatment, in which the sample was heated in the air at 300° C. for 1 hour. Thus, sample 36 was obtained. Still another alloy was heated in a steam atmosphere at 300° C. for 1 hour to obtain sample 37.

The samples thus produced were evaluated for resin bonding strength in accordance with JIS K 6850 in the same manner as in Example 1. The bonding strength of each sample was measured after the drying, after 100 cycles in the thermal cycling test, and after each of the 100-hour PCT and the 100-hour HAST. The results obtained are shown in Table 6.

The test pieces (sample 35–37) which had undergone any of the surface treatments described above had higher shear strengths than the test pieces (sample 34) which had undergone no surface treatment.

TABLE 6

| Sample | SiC content (wt %) | Particle diameter of SiC (mm) | Initial strength (kgf/mm²) | Strength after thermal cycling (kgf/mm²) | Strength after PCT (kgf/mm²) | Strength after HAST (kgf/mm²) |
|---|---|---|---|---|---|---|
| 34 | 50 | 40 | 1.5 | 1.0 | 0.8 | 0.9 |
| 35 | 50 | 40 | 1.7 | 1.2 | 1.0 | 1.1 |
| 36 | 50 | 40 | 1.6 | 1.2 | 1.0 | 1.0 |
| 37 | 50 | 40 | 1.6 | 1.1 | 1.0 | 1.0 |

EXAMPLE 7

An aluminum powder having an average particle diameter of 25 µm was mixed with a silicon carbide powder having an average particle diameter of 35 µm in such a proportion as to result in a silicon carbide content of 50% by weight. The mixture was homogenized with a kneader for 1 hour in the same manner as in the above Examples. Thus, an aluminum/silicon carbide starting powder was obtained. The starting powder obtained was compacted at a pressure of 7 t/cm². The resultant compacts were sintered at 700° C. for 2 hours in a nitrogen atmosphere having a nitrogen concentration of 99% by volume or higher. As a result, aluminum/silicon carbide composite alloy sinters were obtained which retained the original flat-plate shape of the compacted test pieces.

One of the alloys obtained was treated with an alkaline solution for 1 minute to etch the aluminum. The resultant surface was subjected to zincate conversion and then electroless plating to deposit a 100-µm copper layer. Thereafter, the plated alloy was polished on each side with a lap to remove a surface layer in a thickness of 50 µm. The surface roughness, $R_{max}$, of the plated alloy prior to the polishing was 60 µm, which decreased to 2 µm through the polishing. A 5-µm Ni—P layer was further deposited thereon by electroless plating. Thus, sample 38 was obtained.

Another alloy was treated with an alkaline solution for 1 minute to etch the aluminum. The resultant surface was subjected to zincate conversion and then electroless plating to deposit a 100-µm m Ni—P layer. Thereafter, the plated alloy was polished on each side with a lap to remove a surface layer in a thickness of 50 μm. The surface roughness, $R_{max}$, of the plated alloy prior to the polishing was 60 μm, which decreased only to 30 μm through the polishing. A 5-μm Ni—P layer was further deposited thereon by electroless plating. Thus, sample 39 was obtained.

The test pieces obtained above were subjected to the PCT to evaluate corrosion resistance. In the PCT, the appearance of each test piece was examined after a 100-hour treatment under the partial-saturation conditions of 121° C., 100% RH, and 2 atm. Furthermore, a solder flow test was conducted as follows using a eutectic solder preform having dimensions of 10 mm by 10 mm by 0.2 mm (thickness). The preform was put on a sample and placed in a solder reflow at 215° C. for 1 minute, and the flow state of the solder was then examined. The results obtained are shown in Table 7.

The sample 38 plated with copper underwent no change in appearance through the PCT and was satisfactory also in solder flow. The sample 39 which had undergone Ni—P plating alone was found after the PCT to have stained. In the solder flow test, part of the solder did not flow on this sample.

TABLE 7

|  | After PCT | Solder flow |
| --- | --- | --- |
| Sample 38 | ○ | ○ |
| Sample 39 | staining | partly underwent no solder flow |

EXAMPLE 8

An aluminum powder having an average particle diameter of 25 μm was mixed with a silicon carbide powder having an average particle diameter of 35 μm in such a proportion as to result in a silicon carbide content of 50% by weight. The mixture was homogenized with a kneader for 1 hour in the same manner as in the above Examples. Thus, an aluminum/silicon carbide starting powder was obtained The starting powder obtained was compacted at a pressure of 7 t/cm². The resultant compacts were sintered at 700° C. for 2 hours in a nitrogen atmosphere having a nitrogen concentration of 99% by volume or higher. As a result, aluminum/silicon carbide composite alloy sinters were obtained which retained the original shape of the compacted test pieces.

The alloy obtained was treated with an alkaline solution for 1 minute to etch the aluminum. The resultant surface was subjected to zincate conversion and then plated with tin in a thickness of 50 μm. The plated alloy was heated in an infrared oven at 250° C. for 10 minutes, upon which the tin deposit melted and flowed into the depressions of the Al—SiC surface. The surface roughness, $R_{max}$, of the plated alloy prior to the heating was 60 μm, which decreased to 5 μm through the heating. A 5-μm Ni—P layer was further deposited thereon by electroless plating. Thus, sample was obtained.

The test pieces obtained above were subjected to the PCT to evaluate corrosion resistance. In the PCT, the appearance of each test piece was examined after a 100-hour treatment under the partial-saturation conditions of 121° C., 100% RH, and 2 atm. Furthermore, a solder flow test was conducted as follows using a eutectic solder preform having dimensions of 10 mm by 10 mm by 0.2 mm (thickness). The preform was put on the sample and placed in a solder reflow at 215° C. for 1 minute, and the flow state of the solder was then examined. The results obtained are shown in Table 8.

This sample underwent no change in appearance through the PCT and was satisfactory also in solder flow.

TABLE 8

|  | After PCT | Solder flow |
| --- | --- | --- |
| Sample | ○ | ○ |

EXAMPLE 9

An aluminum powder having an average particle diameter of 25 μm was mixed with a silicon carbide powder having an average particle diameter of 35 μm in such a proportion as to result in a silicon carbide content of 50% by weight. The mixture was homogenized with a kneader for 1 hour in the same manner as in the above Example 5. Thus, an aluminum/silicon carbide starting powder was obtained. The starting powder obtained was compacted at a pressure of 7 t/cm². The resultant compacts were sintered at 700° C. for 2 hours in a nitrogen atmosphere having a nitrogen concentration of 99% by volume or higher. As a result, aluminum/silicon carbide composite alloy sinters were obtained which retained the original shape of the compacted test pieces.

The surface of the alloy obtained was coated with an epoxy resin in a thickness of 100 μm by screen printing. The epoxy resin contained 70% by weight copper filler having an average particle diameter of 5 μm. After the screen printing, the alloy was heated at 180° C. for 1 hour in a nitrogen atmosphere to cure the resin. Further another sample was also prepared by dip-coating with the same kind of epoxy resin containing no filler in a thickness of 10 μm. This sample was also heated in the same manner as the above to cure the resin. Thereafter, the coated alloy samples were polished on each side with a lap to remove a surface layer in a thickness of 50 μm. The surface roughness, $R_{max}$, of the alloy samples prior to the epoxy resin application were both 60 μm, which decreased to 2 μm through the coating and the polishing. The polished surfaces were subjected to lead conversion, and a 5-μm Ni—P layer was further deposited thereon by electroless plating. Thus, two kinds of samples were obtained.

The test pieces obtained above were subjected to the PCT to evaluate corrosion resistance. In the PCT, the appearance of each test piece was examined after a 100-hour treatment under the partial-saturation conditions of 121° C., 100% RH, and 2 atm. Furthermore, a solder flow test was conducted as follows using a eutectic solder preform having dimensions of 10 mm by 10 mm by 0.2 mm (thickness). The preform was put on a sample and placed in a solder reflow at 215° C. for 1 minute, and the flow state of the solder was then examined. The results obtained are shown in Table 9.

These samples underwent no change in appearance through the PCT and was satisfactory also in solder flow.

TABLE 9

|  | After PCT | Solder flow |
| --- | --- | --- |
| Sample 1 using resin contained filler | ○ | ○ |
| Sample 2 using a filler-free resin | ○ | ○ |

EXAMPLE 10

An aluminum powder having an average particle diameter of 40 μm was mixed with a silicon carbide powder having an average particle diameter of 35 μm in such a proportion as to result in a silicon carbide content of 50% by weight. The mixture was homogenized with a kneader for 1 hour in the same manner as in the above Example 5. Thus, an aluminum/silicon carbide starting powder was obtained. The starting powder obtained was compacted at a pressure of 7 t/cm$^2$. The resultant compacts were sintered at 700° C. for 2 hours in a nitrogen atmosphere having a nitrogen concentration of 99% by volume or higher. As a result, aluminum/silicon carbide composite alloy sinters were obtained which retained the original shape of the compacted test pieces. The dimensions of each sinter were 40 mm by 40 mm by 2 mm (thickness).

This sample was treated with an alkaline solution for 1 minute to etch the aluminum, and the resultant surface was subjected to zincate conversion. About ten pieces of the thus-treated sample were placed in a jig for barrel plating, and this jig was introduced into an electroless copper plating bath. Ten copper spheres having any of particle diameters ranging from 0.05 to 15 mm were simultaneously placed in the jig for barrel plating. Barrel plating was conducted for 1 hour in the jig in that state. A 5-μm Ni—P layer was then deposited by electroless plating.

The test pieces obtained above were subjected to the PCT to evaluate corrosion resistance. In the PCT, the appearance of each test piece was examined after a 100-hour treatment under the partial-saturation conditions of 121° C., 100% RH, and 2 atm.

The samples 41,42,43 obtained through barrel plating using the copper spheres having partial diameters ranging from 0.1 to 10 mm had a satisfactory appearance both in the initial stage and after the PCT. The sample 40 obtained using the copper spheres having a particle diameter of 0.05 mm stained through the PCT. The sample 44 obtained using the copper spheres having a particle diameter of 15 mm had many collision marks in the initial stage.

TABLE 10

| | Diameter of copper spheres (mm) | Time for barrel plating (min) | Initial appearance | Appearance after PCT |
|---|---|---|---|---|
| *40 | 0.05 | 60 | ○ | staining |
| 41 | 0.1 | 60 | ○ | ○ |
| 42 | 1 | 60 | ○ | ○ |
| 43 | 10 | 60 | ○ | ○ |
| *44 | 15 | 60 | collision marks | collision marks |

Barrel plating was conducted for 30 minutes in the same manner as the above, except that the copper spheres having a particle diameter of 1 mm used above were replaced with copper particles having a surface area two times that of those copper particles. A 5-μm Ni—P layer was then deposited by electroless plating. As a result sample 45 was obtained. For the purpose of comparison, 30-minute barrel plating was conducted using the copper spheres having a particle diameter of 1 mm, and a 5-μm Ni—P layer was then deposited by electroless plating to produce a comparative sample 46.

The test pieces obtained above were subjected to the PCT to evaluate corrosion resistance. In the PCT, the appearance of each test piece was examined after a 100-hour treatment under the partial-saturation conditions of 121° C., 100% RH, and 2 atm. The sample 45 obtained using the copper particles having a two-fold surface area had a satisfactory appearance both in the initial stage and after the PCT. However, the sample 46 obtained using the copper spheres having a smaller surface area stained through the PCT. And in order to refer to the samples, the samples 46, 47 obtained through barrel plating for 1 hour or 2 hours using the copper spheres having diameter of 1 mm instead of the copper spheres.

TABLE 11

| | Diameter of copper spheres (mm) | Time for barrel plating (min) | Initial appearance | Appearance after PCT |
|---|---|---|---|---|
| 45 | 1.0 | 30 | ○ | ○ |
| *46 | 1.0 | 30 | ○ | staining |
| *47 | 1.0 | 60 | ○ | staining |
| *48 | 1.0 | 120 | collision marks | collision marks staining |

The test pieces obtained above were subjected to the PCT to evaluate corrosion resistance. In the PCT, the appearance of each test piece was examined after a 100-hour treatment under the partial-saturation conditions of 121° C., 100% RH, and 2 atm.

The sample 47 obtained through 1-hour barrel plating stained through the PCT. The sample 48 obtained through 2-hour barrel plating had many collision marks in the initial stage, and stained through the PCT.

EXAMPLE 11

An aluminum powder having an average particle diameter of 25 μm was mixed in various proportions with a silicon carbide powder having an average particle diameter of 35 μm to prepare sample powders 49 to 55 respectively having silicon carbide contents of 10%, 20%, 30%, 40%, 50%, 60%, and 70% by weight as shown Table 12. These sample powders each was homogenized with a kneader for 1 hour to obtain aluminum/silicon carbide starting powders.

The starting powders obtained were compacted at a pressure of 7 t/cm$^2$ to obtain test pieces having dimensions of 100 mm by 25 mm by 2 mm (thickness). These compacts were sintered at 700° C. for 2 hours in a nitrogen atmosphere having a nitrogen concentration of 99% by volume or higher. As a result, aluminum/silicon carbide composite alloy sinters were obtained which retained the original shape of the compacted test pieces.

A section of each sinter obtained was examined with an SEM to measure the depth of the holes. The results obtained are shown in Table 12. The surface roughness of each sinter was measured with a surface roughness tester. In each sinter, the $R_{max}$ was found to be almost directly proportional to the depth of the holes and be within the range of from 0.1 to 20 μm.

One side of each sinter obtained was subjected to aluminum vapor deposition as follows. The Al—SiC sinter was placed in a vacuum chamber for vapor deposition. After the chamber was evacuated to a vacuum of 10$^{-5}$ Torr or lower, vapor deposition was conducted using aluminum having a purity of 99.9% by weight or higher as a deposit source. During the vapor deposition, the degree of vacuum was from 10$^{-3}$ to 10$^{-5}$ Torr and the temperature of the Al—SiC surface was from 100 to 200° C.

The thickness of the aluminum film deposited on each Al—SiC sinter and the crystal grain diameter thereof are shown in Table 12. The thickness of the native oxide film on the aluminum film was measured by micro-Auger electron spectroscopy. The results obtained are shown in Table 12.

The samples thus produced were evaluated for resin bonding strength in accordance with JIS K 6850 as follows. A liquid epoxy resin containing 70% by weight silver filler was applied to a sample piece in a resin thickness of 25 μm. This sample piece was placed on another Al—SiC sample piece in the manner shown in FIG. 11. The resultant structure was heated at 180° C. for 1 hour to cure the resin, and then dried at 150° C. for 24 hours.

The test pieces thus obtained according to JIS K 6850 were examined for bonding strength after the drying and after each of the thermal cycling test, PCT (pressure cooker test), and HAST (highly accelerated stress test). In the thermal cycling test, the strength was measured after 100 cycles each consisting of 30-minute exposure to a 150° C. atmosphere and 30-minute exposure to −65° C. atmosphere. In the PCT, the strength was measured after a 100-hour treatment under the partial-saturation conditions of 121° C., 100% RH, and 2 atm. In the HAST, the strength was measured after a 100-hour treatment under the conditions of 125° C., 85% RH, and 2 atm. The results obtained are shown in Table 12. The measurement of bonding strength was made with a precision universal tester (Autograph). A test piece to which two test substrates A are bonded, was held by the holding regions with the grips of the tester. The test piece was pulled at a rate of 50 mm/min while taking care to keep the major axis of the test piece and the center line of the grips on the same straight line. The maximum load at the time of test piece breakage was recorded, and this value was divided by the area of the resin bonding region of the test piece. This quotient was taken as the bonding strength. The test piece breakage occurred in the resin bonding region.

The results show that all the samples retained satisfactory bonding strengths of 0.5 (kgf/mm$^2$) or higher both in the initial stage and after the reliability tests.

For the purpose of comparison, the tensile strength of the resin alone used for bonding was measured as follows. The liquid resin was formed into a sheet, cured at 180° C. for 1 hour, and then dried at 150° C. for 24 hours. The strength thereof after the drying was 2 kgf/mm$^2$. The strength thereof after 100 thermal cycles was 1.6 kgf/mm$^2$, that after the 100-hour PCT was 1.2 kgf/mm$^2$, and that after the 100-hour HAST was 1.3 kgf/mm$^2$. The strength of the cured resin after 1,000 thermal cycles was 1.0 kgf/mm$^2$, that after the 300-hour PCT was 0.7 kgf/mm$^2$, and that after the 300-hour HAST was 0.9 kgf/mm$^2$. It should be noted that the resin bonding strength basically required is the strength at the time of bonding with a resin. In general, bonding strengths not lower than 0.5 kgf/mm$^2$ in terms of shear strength are sufficient. Also important besides the above is the shear strength in initial stages in a thermal cycling test, PCT, and HAST, for example, after initial 100 thermal cycles or after initial 100 hours in an PCT or HAST. In such initial stages in these tests, shear strengths not lower than 0.5 kgf/mm$^2$ are sufficient. Substrates which satisfy the requirement concerning shear strength in this stage generally withstand long-term practical use.

However, in few applications, substrates should satisfy a requirement concerning shear strength after 1,000 thermal cycles or after 300 hours in a PCT or HAST. Since the bonding resin itself has deteriorated, the shear strength level required at such a stage is lower than the above level and is usually higher than 0.3 kgf/mm$^2$.

To sum up, the properties required of a substrate for mounting a semiconductor device are initial resin bonding strength and bonding strength in initial stages in a thermal cycling test, PCT, and HAST. It is however desirable that the shear strength requirement be met even after 1,000 thermal cycles and after 300 hours in a PCT or HAST.

TABLE 12

| Sample | SiC content (wt %) | Depth of holes (μm) | Thickness of Al film (μm) | Thickness of native oxide film (Å) | Diameter of crystal grains (μm) | Initial strength (kgf/mm$^2$) | Strength after 100 thermal cycles (kgf/mm$^2$) | Strength after 100 hours in PCT (kgf/mm$^2$) | Strength after 100 hours in HAST (kgf/mm$^2$) | Strength after 1000 thermal cycles (kgf/mm$^2$) | Strength after 300 hours in PCT (kgf/mm$^2$) | Strength after 300 hours in HAST (kgf/mm$^2$) |
|---|---|---|---|---|---|---|---|---|---|---|---|---|
| 49 | 10 | 40 | 2 | 500 | 1.0 | 2.1 | 1.5 | 1.2 | 1.2 | 0.9 | 0.5 | 0.7 |
| 50 | 20 | 40 | 2 | 500 | 1.0 | 2.1 | 1.5 | 1.2 | 1.2 | 0.9 | 0.6 | 0.7 |
| 51 | 30 | 40 | 2 | 500 | 1.0 | 2.0 | 1.5 | 1.2 | 1.2 | 0.9 | 0.6 | 0.7 |
| 52 | 40 | 40 | 2 | 500 | 1.0 | 2.0 | 1.5 | 1.2 | 1.2 | 0.9 | 0.6 | 0.7 |
| 53 | 50 | 60 | 2 | 500 | 1.0 | 1.9 | 1.4 | 1.1 | 1.2 | 0.9 | 0.5 | 0.7 |
| 54 | 60 | 60 | 2 | 500 | 0.8 | 1.9 | 1.3 | 1.1 | 1.2 | 0.8 | 0.5 | 0.7 |
| 55 | 70 | 70 | 2 | 500 | 0.7 | 1.8 | 1.3 | 1.0 | 1.1 | 0.8 | 0.5 | 0.6 |

Comparative Example 1

Crystal Grain Diameter Below 0.1 mm

Al—SiC sinters were produced in the same manner as in Example 11. An aluminum film was formed by vapor deposition in the same manner as in Example 11, except that the degree of vacuum for the deposition was changed to 10$^{-2}$ to 10$^{-3}$ Torr. The resin bonding strength of each sample 49'–55' obtained as above was measured in accordance with JIS K 6850 using the same resin as in Example 11. The results obtained are shown in Table 13.

The diameters of the crystal grains formed were from 0.04 to 0.05 μm. After the reliability tests, all the samples had resin bonding strengths sufficient for practical use. In particular, the bonding strengths thereof were 0.5 (kgf/mm$^2$) or higher after the reliability tests, including after 300 hours in the PCT and HAST.

TABLE 13

| Sample | SiC content (wt %) | Depth of holes (μm) | Thickness of Al film (μm) | Thickness of native oxide film (Å) | Diameter of crystal grains (μm) | Initial strength (kgf/mm²) | Strength after 100 thermal cycles (kgf/mm²) | Strength after 100 hours in PCT (kgf/mm²) | Strength after 100 hours in HAST (kgf/mm²) | Strength after 1000 thermal cycles (kgf/mm²) | Strength after 300 hours in PCT (kgf/mm²) | Strength after 300 hours in HAST (kgf/mm²) |
|---|---|---|---|---|---|---|---|---|---|---|---|---|
| 49' | 10 | 40 | 2 | 500 | 0.05 | 1.5 | 0.7 | 0.3 | 0.3 | 0.5 | 0.1 | 0.2 |
| 50' | 20 | 40 | 2 | 500 | 0.05 | 1.5 | 0.7 | 0.3 | 0.3 | 0.5 | 0.1 | 0.2 |
| 51' | 30 | 40 | 2 | 500 | 0.05 | 1.4 | 0.7 | 0.3 | 0.3 | 0.5 | 0.1 | 0.2 |
| 52' | 40 | 40 | 2 | 500 | 0.05 | 1.4 | 0.7 | 0.3 | 0.3 | 0.5 | 0.1 | 0.2 |
| 53' | 50 | 60 | 2 | 500 | 0.04 | 1.4 | 0.7 | 0.2 | 0.3 | 0.5 | 0.1 | 0.2 |
| 54' | 60 | 60 | 2 | 500 | 0.04 | 1.3 | 0.5 | 0.2 | 0.3 | 0.4 | 0.1 | 0.2 |
| 55' | 70 | 70 | 2 | 500 | 0.04 | 1.2 | 0.5 | 0.2 | 0.3 | 0.4 | 0.1 | 0.1 |

EXAMPLE 12

Influence of Crystal Grain Diameter

Al—SiC sinters having an SiC content of 50% by weight were produced in the same manner as in Example 11. In producing the sinters, the oxygen atmosphere for sintering was regulated so as to result in a hole depth of 10 μm to thereby facilitate the control of vacuum during aluminum vapor deposition. In aluminum film deposition, the degree of vacuum was varied in the range of from $10^{-2}$ to $10^{-6}$ Torr to form aluminum films varying in crystal grain diameter. Except the above, an aluminum film was formed on each sinter in the same manner as in Example 11. The resin bonding strength of each sample was measured in accordance with JIS K 6850 using the same resin as in Example 11. The results obtained are shown in Table 14. The results show that the samples having crystal grain diameters in the range of from 0.1 to 10 μm retained sufficient resin bonding strengths of 0.5 (kgf/mm²) or higher even after the reliability tests. However, the samples having crystal grain diameters outside that range considerably deteriorated in resin bonding strength through the reliability tests. In particular, these comparative samples had bonding strengths below 0.5 (kgf/mm²) after the PCT and HAST, and were unable to retain a sufficient bonding strength.

EXAMPLE 13

Al—SiC sinters having an SiC content of 50% by weight were produced in the same manner as in Example 11. In producing the sinters, the oxygen atmosphere for sintering was regulated so as to result in a hole depth of 10 μm. Thereafter, blasting was conducted to form holes having the depths shown in Table 15. An aluminum film was formed on each sinter in the same manner as in Example 11. However, with respect to the sample having a hole depth of 200 μm or larger, it was impossible to maintain a vacuum of from $10^{-3}$ to $10^{-5}$ Torr during film formation because of gas diffusion from the holes of the Al—SiC substrate into the vacuum system, so that a vacuum of $10^{-2}$ to $10^{-3}$ Torr was used.

The resin bonding strength of each sample was measured in accordance with JIS K 6850 using the same resin as in Example 11. The results obtained are shown in Table 15. The results show that the samples having hole depths not larger than 100 μm retained sufficient resin bonding strengths of 0.5 (kgf/mm²) or higher even after the reliability tests. However, the sample having a hole depth exceeding 100 μm considerably deteriorated in resin bonding strength through the long-term (300-hours) reliability tests. In particular, its bonding strengths were not higher than 0.3 (kgf/mm²) after the PCT and HAST; this sample was unable to attain the most desirable reliability level, although it satisfied the reliability level required after the initial reliability tests and were capable of withstanding ordinary practical use.

TABLE 14

| Sample | SiC content (wt %) | Depth of holes (μm) | Thickness of Al film (μm) | Thickness of native oxide film (Å) | Diameter of crystal grains (μm) | Initial strength (kgf/mm²) | Strength after 100 thermal cycles (kgf/mm²) | Strength after 100 hours in PCT (kgf/mm²) | Strength after 100 hours in HAST (kgf/mm²) | Strength after 1000 thermal cycles (kgf/mm²) | Strength after 300 hours in PCT (kgf/mm²) | Strength after 300 hours in HAST (kgf/mm²) |
|---|---|---|---|---|---|---|---|---|---|---|---|---|
| *56 | 50 | 10 | 2 | 500 | 0.05 | 1.4 | 0.7 | 0.2 | 0.3 | 0.5 | 0.1 | 0.2 |
| 57 | 50 | 10 | 2 | 500 | 0.1 | 1.5 | 1.2 | 0.9 | 1.0 | 1.0 | 0.7 | 0.9 |
| 58 | 50 | 10 | 2 | 500 | 1.0 | 1.9 | 1.4 | 1.1 | 1.2 | 1.2 | 0.9 | 1.0 |
| 59 | 50 | 10 | 2 | 500 | 10 | 1.4 | 1.0 | 0.8 | 0.9 | 0.8 | 0.6 | 0.7 |
| *60 | 50 | 10 | 2 | 500 | 20 | 1.4 | 0.7 | 0.2 | 0.3 | 0.6 | 0.1 | 0.1 |

*: comparative example

TABLE 15

| Sample | SiC content (wt %) | Depth of holes (μm) | Thickness of Al film (μm) | Thickness of native oxide film (Å) | Diameter of crystal grains (μm) | Initial strength (kgf/mm²) | Strength after 100 thermal cycles (kgf/mm²) | Strength after 100 hours in PCT (kgf/mm²) | Strength after 100 hours in HAST (kgf/mm²) | Strength after 1000 thermal cycles (kgf/mm²) | Strength after 300 hours in PCT (kgf/mm²) | Strength after 300 hours in HAST (kgf/mm²) |
|---|---|---|---|---|---|---|---|---|---|---|---|---|
| 61 | 50 | 10 | 2 | 500 | 1.0 | 1.9 | 1.4 | 1.1 | 1.2 | 0.9 | 0.7 | 0.8 |
| 62 | 50 | 50 | 2 | 500 | 1.0 | 1.9 | 1.4 | 1.1 | 1.2 | 0.8 | 0.7 | 0.8 |
| 63 | 50 | 70 | 2 | 500 | 2.0 | 1.7 | 1.2 | 1.0 | 1.1 | 0.8 | 0.6 | 0.7 |
| 64 | 50 | 100 | 2 | 500 | 0.1 | 1.4 | 1.0 | 0.8 | 0.9 | 0.8 | 0.4 | 0.5 |
| 65 | 50 | 260 | 2 | 500 | 0.1 | 1.4 | 0.7 | 0.6 | 0.7 | 0.6 | 0.2 | 0.3 |

EXAMPLE 14

Al—SiC sinters having an SiC content of 50% by weight were produced in the same manner as in Example 11. In producing the sinters, the oxygen atmosphere for sintering was regulated so as to result in a hole depth of 10 μm. Thereafter, blasting was conducted to form holes having the depths shown in Table 16. On the other hand, polishing was conducted to form holes having the depths shown in Table 16. The values of $R_{max}$ determined with a surface roughness tester are also shown in Table 16. An aluminum film was formed on each sinter in the same manner as in Example 11. The resin bonding strength of each sample was measured in accordance with JIS K 6850 using the same resin as in Example 11.

The results obtained show the following. The sample having a crystal grain diameter of 1.0 mm but having an $R_{max}$ lower than 0.1 μm considerably deteriorated in resin bonding strength through the reliability tests. In particular, this sample had bonding strengths not higher than 0.3 (kgf/mm²) after the long-term (300-hour) PCT and HAST and was unable to retain a sufficient bonding strength, although the resin bonding strengths thereof in the initial stages in the PCT and HAST (up to 100 hours) were not lower than 0.5 kgf/mm², which values are sufficient for practical use. On the other hand, the sample having a crystal grain diameter of 0.1 μm but having an $R_{max}$ higher than 20 μm also considerably deteriorated in resin bonding strength and, in particular, came to have bonding strengths not higher than 0.3 (kgf/mm²) through the long-term PCT and HAST, although the bonding strengths thereof were sufficient for practical use. Thus, these two samples were unable to attain the most desirable reliability level.

Comparative Example 2

Influence of the Thickness of Native Oxide Film on Aluminum Film

Al—SiC sinters having an SiC content of 50% by weight were produced in the same manner as in Example 11. An aluminum film of thickness of 2 μm, was formed on each sinter in the same manner as in Example 11. Holes of depth of 60 μm were formed on a surface of the sinters. The diameter of the crystal grains formed was 1.0 μm. Thereafter, the sinters were heated to 300° C. in the air with a furnace to form an oxide film in a thickness of 1500 Å on the aluminum film. The resin bonding strength of the sample was measured in accordance with JIS K 6850 using the same resin as in Example 11. The results obtained are shown in Table 16 under No. 71.

The sample 71 considerably deteriorated in resin bonding strength through the reliability tests. In particular, its bonding strengths after the PCT and HAST were lower than 0.5 (kgf/mm²), and the sample 71 was unable to retain a sufficient bonding strength. The breakage of the test pieces occurred at the interface between the aluminum oxide film and the aluminum film, in contrast to the test pieces in other Examples in which breakage occurred at the interface between the resin and the aluminum film.

Comparative Example 3

Influence of the Alumite Treatment of Aluminum Film

Al—SiC sinters having an SiC content of 50% by weight were produced in the same manner as in Example 11. An

TABLE 16

| Sample | $R_{max}$ (μm) | SiC content (wt %) | Depth of holes (μm) | Thickness of Al film (μm) | Thickness of native oxide film (Å) | Diameter of crystal grains (μm) | Initial strength (kgf/mm²) | Strength after 100 thermal cycles (kgf/mm²) | Strength after 100 hours in PCT (kgf/mm²) | Strength after 100 hours in HAST (kgf/mm²) | Strength after 1000 thermal cycles (kgf/mm²) | Strength after 300 hours in PCT (kgf/mm²) | Strength after 300 hours in HAST (kgf/mm²) |
|---|---|---|---|---|---|---|---|---|---|---|---|---|---|
| 66 | 0.08 | | | 2 | 500 | 1.0 | 1.4 | 0.7 | 0.6 | 0.7 | 0.5 | 0.2 | 0.3 |
| 67 | 0.12 | | | 2 | 500 | 1.0 | 1.4 | 1.0 | 0.8 | 0.9 | 1.0 | 0.6 | 0.7 |
| 68 | 10 | | | 2 | 500 | 1.0 | 1.9 | 1.4 | 1.1 | 1.2 | 1.2 | 0.7 | 0.8 |
| 69 | 20 | | | 2 | 500 | 0.1 | 1.4 | 0.9 | 0.7 | 0.8 | 0.7 | 0.5 | 0.6 |
| 70 | 30 | | | 2 | 500 | 0.1 | 1.4 | 0.7 | 0.6 | 0.7 | 0.5 | 0.2 | 0.3 |
| *71 | | 50 | 60 | 2 | 1500 | 1.0 | 0.8 | 0.4 | 0.1 | 0.2 | | | |
| 72 | | 50 | 60 | 2 | 500 | 1.0 | 1.8 | 1.4 | 1.1 | 1.2 | 0.9 | 0.7 | 0.8 | aluminum film was formed on each sinter in the same manner as in Example 11. Thereafter, an alumite layer was formed in a thickness of 500 Å. The resin bonding strength of the sample was measured in accordance with JIS K 6850 using the same resin as in Example 1. The results obtained are shown in Table 16 under No. 72.

The results show that the sample was capable of retaining satisfactory bonding strengths not lower than 0.5 (kgf/mm$^2$) both in the initial stage and after the reliability tests. However, the electrical conductivity of the Al—SiC was impaired due to the alumite treatment.

EXAMPLE 15

Influence of Film Thickness

Al—SiC sinters having an SiC content of 50% by weight were produced in the same manner as in Example 11. An aluminum film was formed on the sinters in the same manner as in Example 11 in various thicknesses as shown in Table 17. The resin bonding strength of each sample was measured in accordance with JIS K 6850 using the same resin as in Example 1. The results obtained are shown in Table 17. The results show the following. The sample having an aluminum layer thickness smaller than 0.1 μm considerably deteriorated in resin bonding strength through the reliability tests. In particular, its bonding strengths after the PCT and HAST were lower than 0.5 (kgf/mm$^2$) and the sample was unable to retain a sufficient bonding strength. On the other hand, the sample having an aluminum film thickness larger than 100 μm had resin bonding strengths after 100-hour treatments in the PCT and HAST of 0.5 kgf/mm$^2$ or higher, which values are sufficient for practical use. However, this sample considerably deteriorated in resin bonding strength especially through the long-term ( up to 300-hour) PCT and HAST to come to have a bonding strength of 0.3 (kgf/mm$^2$), and was unable to attain the most desirable reliability level. In this sample having an aluminum layer thickness larger than 100 μm, the breakage of the test pieces occurred within the aluminum layer. It is required more than 10 hours to form the aluminum layer thickness larger than 100 μm by vapor deposition. Further as another sample, the sinters having aluminum film of 20 μm thickness was formed on in the same manner as in Example 11. In the case of this it is required more than 1 hour to form the aluminum layer thickness of 20 μm. In considering a productivity, it is sufficient to form the aluminum layer thickness of 20 μm.

EXAMPLE 16

Influence of Film Composition

Al—SiC sinters having an SiC content of 50% by weight were produced in the same manner as in Example 11. Thereafter, an aluminum film was formed on the sinters so as to produce samples 78 to 82 in which sample 78 had an Al—Mg alloy film having an aluminum content of 99 wt % or higher, sample 79 had an Al—Mn alloy film having an aluminum content of 99 wt % or higher, sample 80 had an Al—Si alloy film having an aluminum content of 99 wt % or higher, sample 81 had an Al—Cu alloy film having an aluminum content of 99 wt % or higher, and sample 82 had an Al—Cu—Si alloy film having an aluminum content of 99 wt % or higher. The resin bonding strength of each sample was measured in accordance with JIS K 6850 using the same resin as in Example 11. The results obtained are shown in Table 18 under No. 78 to 82. The results show that these samples were capable of retaining satisfactory bonding strengths not lower than 0.5 (kgf/mm$^2$) both in the initial stage and after the reliability tests. On the other hand, samples 83 to 87 were produced by forming aluminum-based films having various compositions by vapor deposition on Al—SiC sinter substrates having an SiC content of 50% by weight produced by the same method as the above. Sample 83 had an Al—Mg alloy film having an aluminum content of 90 wt %; sample 84 had an Al—Mn alloy film having an aluminum content of 90 wt %; sample 85 had an Al—Si alloy film having an aluminum content of 90 wt %; sample 86 had an Al—Cu alloy film having an aluminum content of 90 wt %; and sample 87 had a duralmin film consisting of 94.5 wt % aluminum, 4 wt % copper, 0.5 wt % magnesium, 0.5 wt % manganese, and 0.5 wt % Fe and Si. Although fifty pieces were prepared for each sample, they fluctuated in film composition. For each sample, the ten pieces whose compositions were the most close to the composition shown above were selected and subjected to the same evaluation as the above. The results obtained are shown in Table 18 under No. 83 to 87. The results show that samples 83 to 87 were capable of retaining strengths not lower than 0.5 kgf/mm$^2$, although inferior in bonding strength after the long-term tests to samples 78 to 82, in which the deposited films had an aluminum content of 99% by weight or higher.

TABLE 17

| Sample | SiC content (wt %) | Depth of holes (μm) | Thickness of Al film (μm) | Thickness of native oxide film (Å) | Diameter of crystal grains (μm) | Initial strength (kgf/mm$^2$) | Strength after 100 thermal cycles (kgf/mm$^2$) | Strength after 100 hours in PCT (kgf/mm$^2$) | Strength after 100 hours in HAST (kgf/mm$^2$) | Strength after 1000 thermal cycles (kgf/mm$^2$) | Strength after 300 hours in PCT | Strength after 300 hours in HAST |
|---|---|---|---|---|---|---|---|---|---|---|---|---|
| 73 | 50 | 60 | 0.08 | 500 | 1.0 | 1.0 | 0.5 | 0.2 | 0.3 | 0.6 | 0.3 | 0.3 |
| 74 | 50 | 60 | 0.1 | 500 | 1.0 | 1.2 | 0.9 | 0.7 | 0.8 | 0.7 | 0.5 | 0.5 |
| 75 | 50 | 60 | 2 | 500 | 1.0 | 1.9 | 1.4 | 1.1 | 1.2 | 0.8 | 0.6 | 0.7 |
| 76 | 50 | 60 | 100 | 500 | 1.0 | 1.4 | 1.0 | 0.8 | 0.9 | 0.7 | 0.5 | 0.6 |
| 77 | 50 | 60 | 150 | 500 | 1.0 | 1.0 | 0.8 | 0.5 | 0.6 | 0.6 | 0.3 | 0.3 |

TABLE 18

| Sample No. | SiC content (wt %) | Depth of holes (μm) | Thickness of Al film (μm) | Thickness of naturally formed oxide film (Å) | Diameter of crystal grains (μm) | Initial strength (kgf/mm²) | Strength after 100 thermal cycles (kgf/mm²) | Strength after 100 hours in PCT (kgf/mm²) | Strength after 100 hours in HAST (kgf/mm²) | Strength after 1000 thermal cycles (kgf/mm²) | Strength after 300 hours in PCT (kgf/mm²) | Strength after 300 hours in HAST (kgf/mm²) |
|---|---|---|---|---|---|---|---|---|---|---|---|---|
| 78 | 50 | 60 | 2 | 500 | 1.0 | 1.8 | 1.3 | 1.0 | 1.1 | 0.9 | 0.6 | 0.7 |
| 79 | 50 | 60 | 2 | 500 | 1.0 | 1.7 | 1.2 | 1.0 | 1.1 | 0.9 | 0.6 | 0.7 |
| 80 | 50 | 60 | 2 | 500 | 1.0 | 1.9 | 1.4 | 1.1 | 1.2 | 1.0 | 0.7 | 0.8 |
| 81 | 50 | 60 | 2 | 500 | 1.0 | 1.5 | 1.1 | 1.0 | 1.1 | 0.8 | 0.6 | 0.7 |
| 82 | 50 | 60 | 2 | 500 | 1.0 | 1.7 | 1.1 | 0.8 | 0.9 | 0.8 | 0.6 | 0.7 |
| 83 | 50 | 60 | 2 | 500 | 1.0 | 1.4 | 1.2 | 0.9 | 1.0 | 0.8 | 0.5 | 0.6 |
| 84 | 50 | 60 | 2 | 500 | 1.0 | 1.5 | 1.2 | 0.9 | 1.0 | 0.8 | 0.5 | 0.6 |
| 85 | 50 | 60 | 2 | 500 | 1.0 | 1.4 | 1.3 | 1.0 | 1.0 | 0.9 | 0.6 | 0.7 |
| 86 | 50 | 60 | 2 | 500 | 1.0 | 1.4 | 1.2 | 1.0 | 1.0 | 0.8 | 0.5 | 0.5 |
| 87 | 50 | 60 | 2 | 500 | 1.0 | 1.4 | 1.2 | 0.9 | 1.0 | 0.8 | 0.5 | 0.5 |

EXAMPLE 17

Other Methods for Aluminum Film Formation

Al—SiC sinters having an SiC content of 50% by weight were produced in the same manner as in Example 11. Thereafter, an aluminum film was formed on these sinters by the following methods to produce samples 88 to 90. That is, for sample 88, an aluminum film was formed by applying a dispersion of aluminum particles in an organic solvent by screen printing in a thickness of 50 mm and sintering the coating at 600° C. for 1 hour in a nitrogen atmosphere. For sample 89, an aluminum film was formed by applying a dispersion of aluminum particles in an organic solvent by dipping in a thickness of 50 μm and sintering the coating at 600° C. for 1 hour in a nitrogen atmosphere. For sample 90, an aluminum film was formed by applying an aluminum powder in a thickness of 50 μm by thermal spraying using an inert gas and sintering the coating at 600° C. for 1 hour in a nitrogen atmosphere. The resin bonding strength of each sample was then measured in accordance with JIS K 6850 using the same resin as in Example 11.

The diameter of crystal grains, the depth of holes, and the thickness of a native oxide film for each sample are shown in Table 19. The results show that samples 88 to 90 were capable of retaining satisfactory bonding strengths not lower than 0.5 (kgf/mm²) both in the initial stage and after the reliability tests.

Figure 3:
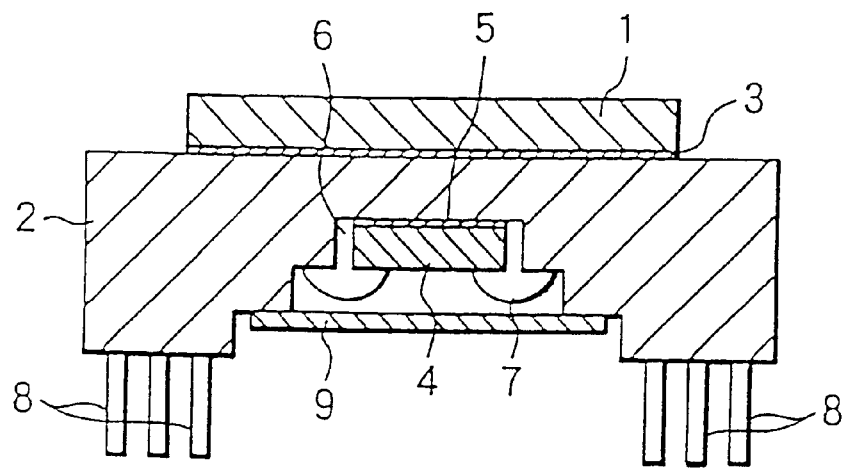
FIG. 3 is a diagrammatic sectional view illustrating one embodiment of an IC package using a substrate made of the substrate material of the present invention.

The IC package illustrated in FIG. 3 employs an aluminum/silicon carbide composite alloy according to the present invention as a substrate 1. The substrate 1 was produced by a process comprising forming a compact having a predetermined shape, sintering the compact, polishing the surface of the resultant alloy sinter, and then plating the surface with nickel by a known means. This substrate 1 has been bonded to a main package body 2 with a highly thermally conductive resin 3, e.g., an epoxy resin filled with a metallic filler.

This main package body 2 has a die attachment part 6 in the center thereof, and a semiconductor chip 4 has been bonded to the part 6 with a bonding material 5, e.g., a resin. One end of a bonding wire 7 has been connected to the pad of the semiconductor chip 4 mounted on the die attachment part 6 for establishing an electrical connection of the semiconductor chip 4 to an external circuit. The other end of the wire 7 has been connected, via a conductive layer formed on the main package body 2, to metallic lead pins 8 attached to the main package body 2 for connection to an external circuit. After the mounting of the semiconductor chip 4, a cover 9 is attached to the main package body 2.

Figure 4:
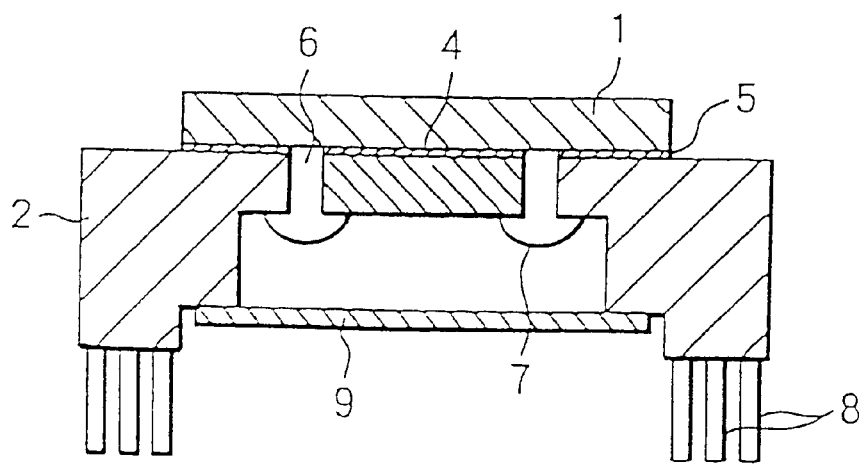
FIG. 4 is a diagrammatic sectional view illustrating another embodiment of the IC package using a substrate made of substrate material of the present invention.

The IC package illustrated in FIG. 4 differs from the package of FIG. 3 in that a semiconductor chip 4 has been directly mounted on a substrate 1 with a bonding material 5 such as a solder or a resin. The surface of this substrate 1 has been plated with Ni—Au by a known method. The main

TABLE 19

| Sample No. | SiC content (wt %) | Depth of holes (μm) | Thickness of Al film (μm) | Thickness of native oxide film (Å) | Diameter of crystal grains (μm) | Initial strength (kgf/mm²) | Strength after 100 thermal cycles (kgf/mm²) | Strength after 100 hours in PCT (kgf/mm²) | Strength after 100 hours in HAST (kgf/mm²) | Strength after 1000 thermal cycles (kgf/mm²) | Strength after 300 hours in PCT (kgf/mm²) | Strength after 300 hours in HAST (kgf/mm²) |
|---|---|---|---|---|---|---|---|---|---|---|---|---|
| 88 | 50 | 60 | 2 | 500 | 1.0 | 1.8 | 1.2 | 0.9 | 1.0 | 0.9 | 0.6 | 0.7 |
| 89 | 50 | 60 | 2 | 500 | 1.0 | 1.8 | 1.2 | 0.9 | 1.0 | 0.9 | 0.6 | 0.7 |
| 90 | 50 | 60 | 2 | 500 | 1.0 | 1.7 | 1.2 | 0.9 | 1.0 | 0.9 | 0.6 | 0.7 |

EXAMPLE 18

As application examples of the semiconductor substrate material of the present invention, which comprises an aluminum/silicon carbide composite alloy, IC packages shown in FIGS. 3 to 10 are explained below.

package body 2 has an opening in its bottom part corresponding to a die attachment part 6. The substrate 1 has been bonded to the body 2 with a bonding material 5, e.g., a resin, so that the opening is covered with the substrate 1 and that the semiconductor chip 4 directly mounted on the substrate 1 is housed in the die attachment part 6.

Figure 5:
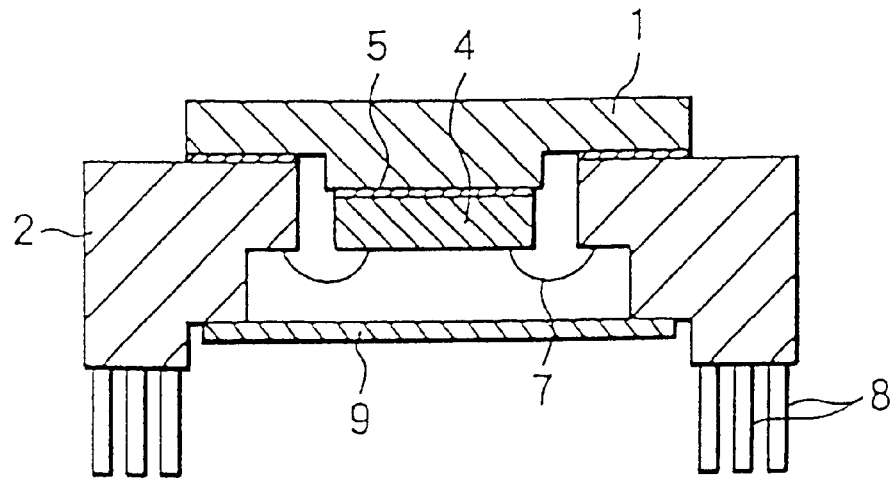
FIG. 5 is a diagrammatic sectional view illustrating still another embodiment of the IC package using a substrate made of substrate material of the present invention.

In IC packages containing a semiconductor chip 4 directly mounted on a substrate 1 as described above, the substrate 1 is not particularly limited in its shape on the side on which the semiconductor chip 4 is mounted. For example, a substrate 1 having a projecting flat part as shown in FIG. 5 can be used. In the package illustrated in FIG. 5, the other constitution is the same as in FIGS. 3 and 4.

The material of the main package body 2 in FIGS. 3 to 5 is not particularly limited. Examples thereof include ceramic materials such as alumina ceramic multilayer substrates having an alumina content around 90%, which are generally used currently, and low-temperature-sintered glass ceramic multilayer substrates containing a glass ceramic and obtained through sintering at around 1,000° C., which cope with high-speed signal processing. Examples thereof further include plastic materials such as plastic multilayer substrates comprising an epoxy or polyimide resin, which are inexpensive and suitable for general purposes. Among the semiconductor substrate materials according to the present invention, those having a thermal conductivity of 180 W/m×K or higher are especially capable of exhibiting an exceedingly high heat dissipation effect when used in combination with plastic package body materials, which have a low thermal conductivity and have a problem concerning heat dissipation when used as they are.

Figure 6:
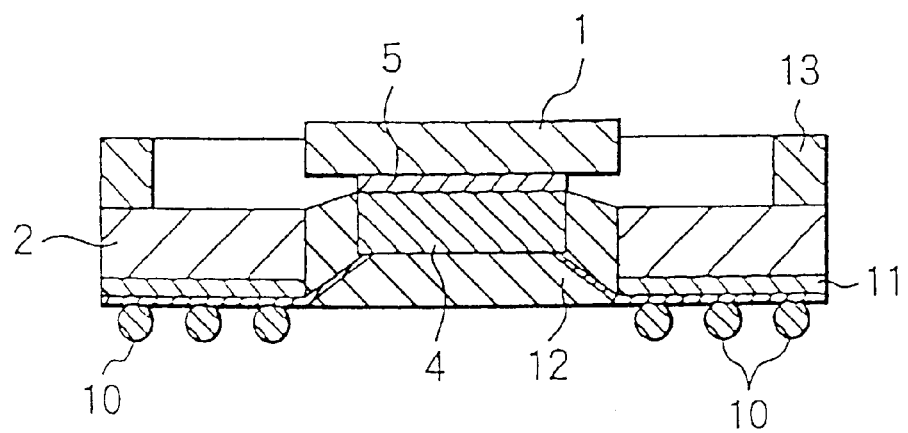
FIG. 6 is a diagrammatic sectional view illustrating one embodiment of an IC package having solder balls and using a substrate made of substrate material of the present invention.
Figure 7:
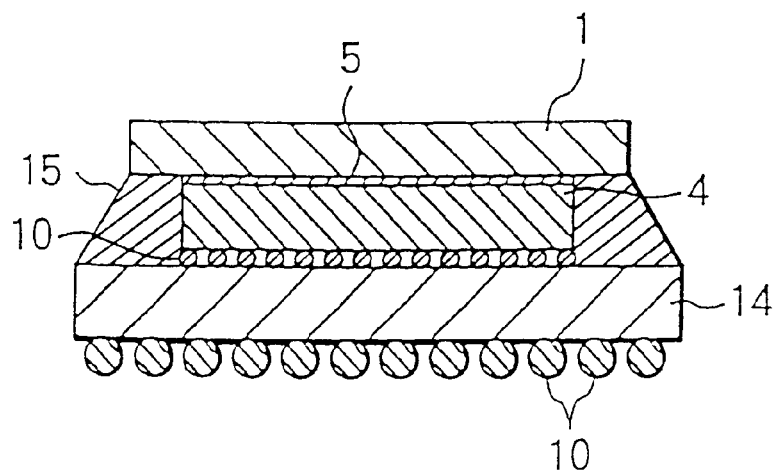
FIG. 7 is a diagrammatic sectional view illustrating another embodiment of the IC package having solder balls and using a substrate made of substrate material of the present invention.

There also are IC packages having a structure in which solder balls 10, in place of metallic lead pins 8, have been attached to a main package body 2 for connection to an external circuit, as shown in FIGS. 6 and 7. These IC packages employ as a substrate 1 an aluminum/silicon carbide composite alloy of a predetermined shape whose surface has been plated with nickel by a known means. This substrate 1 has a semiconductor chip 4 bonded thereto through a bonding material 5, e.g., an adhesive resin.

Figure 8:
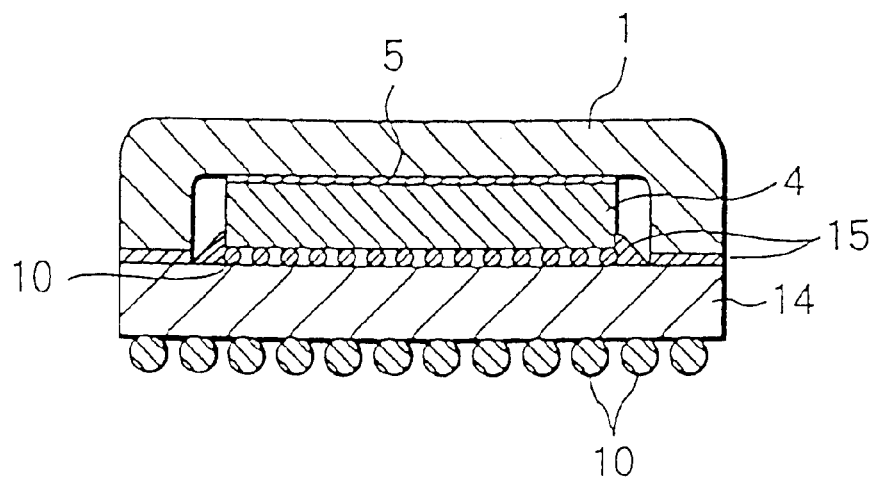
FIG. 8 is a diagrammatic sectional view illustrating still another embodiment of the IC package having solder balls and using a substrate made of substrate material of the present invention.

In the IC package illustrated in FIG. 6, the main package body 2 has a polyimide tape 11 bearing a copper foil circuit wiring 12. The body 2 has, in the center thereof, a semiconductor chip 4 mounted thereon by TAB (tape automated bonding). Further, a support ring 13 has been bonded to the main package body 2 for reinforcing the same. On the other hand, the IC package illustrated in FIG. 7 comprises a semiconductor chip 4 bonded to a substrate 1 and a wiring substrate 14 having solder balls 10 for connection to an external circuit. The semiconductor chip 4 has been mounted by flip chip bonding on the substrate 14 through solder balls 10 formed on the pad of the semiconductor chip 4. The sides of this structure have been sealed with a resin 15 to protect the semiconductor chip 4. Methods for mounting the semiconductor chip 4 in the IC packages illustrated in FIGS. 6 and 7 are not limited to those shown above. Furthermore, the shape of the substrate 1 is not limited to a flat plate, and a substrate in the form of, e.g., a cap as shown in FIG. 8 may be used.

Figure 9:
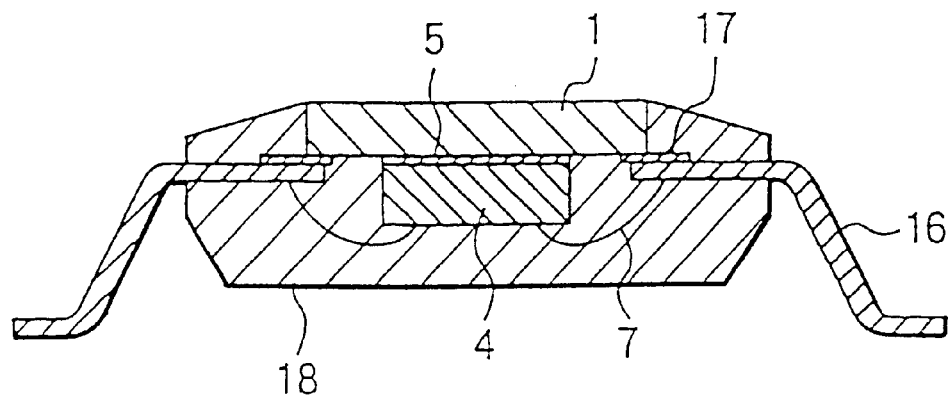
FIG. 9 is a diagrammatic sectional view illustrating one embodiment of an IC package of the mold type using a substrate made of substrate material of the present invention.

The IC package illustrated in FIG. 9 is of the resin mold type. In this package, a substrate 1 having a predetermined shape has been bonded to a lead frame 16 through an insulating film 17. This substrate 1 comprises an aluminum/silicon carbide composite alloy whose surface has been plated with Ni—Au by a known means. A semiconductor chip 4 has been bonded to the substrate 1 through a bonding material 5, e.g., a silver paste. The lead frame 16 has been connected to the bonding pad of the semiconductor chip 4 with a bonding wire 7. The connected semiconductor chip 4 has been embedded, together with the bonding wire 7, with a molding resin 18 by transfer molding.

Figure 10:
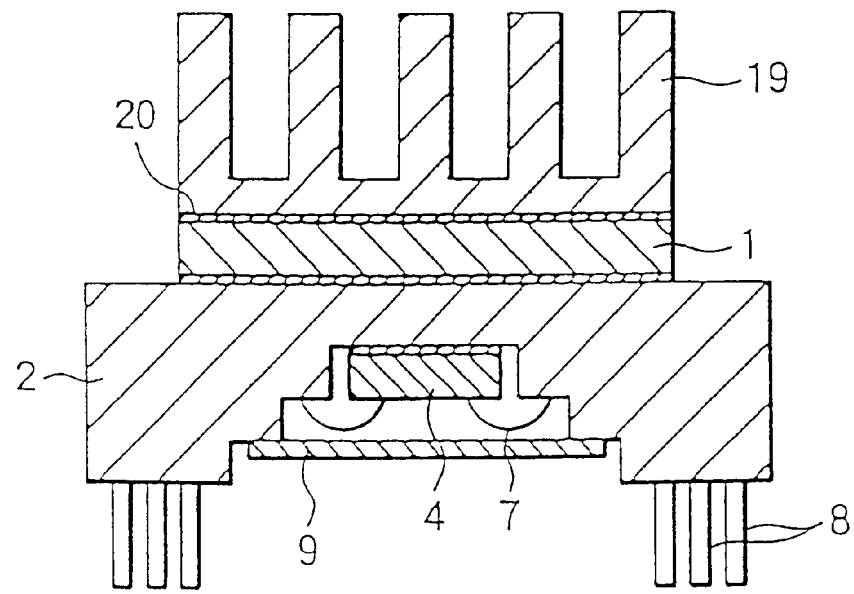
FIG. 10 is a diagrammatic sectional view illustrating one embodiment of an IC package having aluminum fins bonded to a substrate made of substrate material of the present invention.

In the IC packages shown in FIGS. 3 to 10, aluminum fins generally having an anodized surface may be bonded to the substrate 1 comprising an aluminum/silicon carbide composite alloy for the purpose of improving heat dissipation properties. For example, in the case of an IC package of the type shown in FIG. 3, aluminum fins 19 are bonded to the substrate 1 of this IC package through a silicone resin 20 or the like as shown in FIG. 10. Furthermore, the IC packages shown in FIGS. 3 to 10, of course, are applicable to IC packages of the MCM (multi-chip mold) type containing two or more semiconductor chips.

The semiconductor substrate material of the present invention for use as a substrate 1, which material comprises an aluminum/silicon carbide composite alloy, has little difference in thermal expansion coefficient with silicon for use in semiconductor chips and with the materials of generally used main package bodies. Consequently, the semiconductor substrate material is less apt to suffer a thermal strain caused by a thermal stress in package production processes and IC mounting processes. Since the semiconductor substrate material of the present invention has high thermal conductivity and excellent heat dissipation properties, it can be used to fabricate IC packages having a long service life and excellent reliability. Furthermore, because the semiconductor substrate material is lightweight, it is presumed to be effective in stably maintaining the shape of a remelted solder especially in producing packages having solder balls for connection to an external circuit.

The IC packages respectively shown in FIGS. 3 to 9, each having a substrate 1 comprising the semiconductor substrate material of the present invention and containing a semiconductor chip 4, were actually subjected to a thermal cycling test (–60° C.~+150° C.; 100 cycles). As a result, no abnormal operation was observed at all. It was thus ascertained that the substrate was less apt to suffer a thermal strain, which is caused by a thermal stress.

The present invention can provide, through a simple sintering process, a substrate material for mounting a semiconductor device comprising a homogenous aluminum/silicon carbide composite alloy which has a silicon carbide content of from 10 to 70% by weight, especially 35 to 70% by weight. And the material has a thermal conductivity of 100 W/m×K or higher, and a thermal expansion coefficient of $20 \times 10^{-6}$/° C. or lower and is lightweight and is very easy to form This substrate material is usable in various IC packages and is useful especially for plastic packages. Therefore we can form a complex shaped substrate in a fine and near net shape. In addition, because of its high thermal conductivity and excellent heat dissipation properties, the substrate material can be used to fabricate an IC package having a long service life and excellent reliability.

What is claimed is:

1. A semiconductor device, comprising
a substrate comprising a substrate material for mounting a semiconductor device, said substrate material comprising an aluminum/silicon carbide (Al—SiC) composite alloy comprising an Al—SiC alloy composition having an aluminum or aluminum alloy matrix and granular silicon carbide particles dispersed therein wherein said granular silicon carbide particles are dispersed in a concentration of from 10 to 70% by weight and are distributed substantially homogeneously such that fluctuations of the silicon carbide concentration within the Al—SiC composite alloy are less than 1%,
a coating layer coated on a surface of the substrate, and
a semiconductor chip mounted on the substrate.

* * * * *